(12) United States Patent
Ryu et al.

(10) Patent No.: US 12,402,315 B2
(45) Date of Patent: Aug. 26, 2025

(54) MEMORY DEVICE WITH VERTICALLY STACKED SEMICONDUCTOR STRUCTURES

(71) Applicant: SAMSUNG ELECTRONICS CO., LTD., Suwon-si (KR)

(72) Inventors: Hyo Joon Ryu, Hwaseong-si (KR); Seo-Goo Kang, Seoul (KR); Hee Suk Kim, Hwaseong-si (KR); Jong Seon Ahn, Seongnam-si (KR); Kohji Kanamori, Seongnam-si (KR); Jee Hoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/510,736

(22) Filed: Nov. 16, 2023

(65) Prior Publication Data

US 2024/0155842 A1 May 9, 2024

Related U.S. Application Data

(63) Continuation of application No. 17/198,592, filed on Mar. 11, 2021, now abandoned.

(30) Foreign Application Priority Data

Aug. 7, 2020 (KR) ........................ 10-2020-0099300

(51) Int. Cl.
*H10B 43/27* (2023.01)
*H01L 23/522* (2006.01)
*H10B 41/27* (2023.01)

(52) U.S. Cl.
CPC ......... *H10B 43/27* (2023.02); *H01L 23/5226* (2013.01); *H10B 41/27* (2023.02)

(58) Field of Classification Search
CPC ........ H10B 43/27; H10B 41/27; H10B 23/10; H10B 41/10; H10B 41/35; H10B 43/35; H10B 43/40; H01L 23/5226; H01L 23/522

See application file for complete search history.

(56) References Cited

U.S. PATENT DOCUMENTS 6,747,416 B2 * 6/2004 Barger ................. H01J 29/481
                                                              315/169.3
9,905,572 B2   2/2018 Lee et al.
(Continued)

FOREIGN PATENT DOCUMENTS

CN    111403397 B    5/2021
CN    111180453 B   10/2022
(Continued)

OTHER PUBLICATIONS

First Office Action dated Jun. 27, 2024 for corresponding application No. KR 10-2020-0099300.
(Continued)

*Primary Examiner* — William B Partridge
*Assistant Examiner* — David Paul Sedorook
(74) *Attorney, Agent, or Firm* — Wolf, Greenfield & Sacks, P.C.

(57) ABSTRACT

A semiconductor memory device includes a lower stacked structure with lower metal lines on a substrate, an upper stacked structure with an upper metal line on the lower stacked structure, a vertical structure penetrating the upper and lower stacked structures and including a channel layer, a first cutting line through the upper and lower stacked structures, an upper supporter in a recess on the first cutting line, a second cutting line through the upper and lower stacked structures and spaced apart from the first cutting line, a sub-cutting line through the upper stacked structure while at least partially overlapping the vertical structure in (Continued)

the vertical direction, the sub-cutting line being between the first and second cutting lines, top surfaces of the upper supporter and sub-cutting line being coplanar, and a first interlayer insulating layer surrounding a sidewall of each of the upper supporter and the sub-cutting line.

20 Claims, 29 Drawing Sheets

(56) References Cited

U.S. PATENT DOCUMENTS

| | | | |
|---|---|---|---|
| 10,373,969 | B2 | 8/2019 | Zhang et al. |
| 10,559,591 | B2 | 2/2020 | Kanamori et al. |
| 10,707,233 | B1 | 7/2020 | Cui et al. |
| 2016/0056171 | A1* | 2/2016 | Manorotkul ...... H01L 21/02675 |
| | | | 257/66 |
| 2017/0221813 | A1 | 8/2017 | Kim |
| 2017/0250194 | A1 | 8/2017 | Lee et al. |
| 2017/0287928 | A1 | 10/2017 | Kanamori et al. |
| 2018/0277556 | A1 | 9/2018 | Kang |
| 2019/0035798 | A1* | 1/2019 | Hwang .................. H10B 41/40 |
| 2019/0196830 | A1* | 6/2019 | Lilak ..................... H01L 27/088 |
| 2019/0312054 | A1* | 10/2019 | Yun ........................ H10B 43/10 |
| 2019/0348436 | A1 | 11/2019 | Kim et al. |
| 2019/0355740 | A1 | 11/2019 | Hong et al. |
| 2020/0027896 | A1 | 1/2020 | Eom |
| 2020/0075621 | A1 | 3/2020 | Nakaki |
| 2020/0303492 | A1 | 9/2020 | Kim et al. |
| 2021/0104539 | A1* | 4/2021 | Lee ........................ H10B 41/27 |
| 2021/0288058 | A1* | 9/2021 | Nishimura ............. H10B 43/10 |

FOREIGN PATENT DOCUMENTS

| | | |
|---|---|---|
| JP | 2019-096729 A | 6/2019 |
| JP | 2020102612 A | 7/2020 |
| KR | 10-2020-0079145 A | 7/2020 |
| KR | 10-2017-0090183 A | 7/2023 |

OTHER PUBLICATIONS

European Office action dated Feb. 16, 2022 for corresponding EP 21 189 715. 2.

Extended European Search Report dated Feb. 3, 2022 for corresponding EP 21 189 715. 2.

* cited by examiner

MEMORY DEVICE WITH VERTICALLY STACKED SEMICONDUCTOR STRUCTURES

CROSS-REFERENCE TO RELATED APPLICATION

This is a continuation of U.S. application Ser. No. 17/198,592 filed Mar. 11, 2021, which claims priority to Korean Patent Application No. 10-2020-0099300, filed on Aug. 7, 2020, in the Korean Intellectual Property Office, and entitled: "Semiconductor Memory Device," each of these applications being incorporated by reference herein in its entirety.

BACKGROUND

1. Field

The present disclosure relates to a semiconductor memory device.

2. Description of the Related Art

In order to satisfy consumer demands for superior performance and inexpensive prices, it is desired to increase the integration density of semiconductor devices. In a semiconductor device, since the integration density thereof is an important factor in determining the price of a product, an increased integration density is particularly required. In the case of two-dimensional or planar semiconductor devices, since their integration density is mainly determined by the area occupied by a unit memory cell, it is greatly influenced by the level of fine pattern forming technology.

However, since extremely high-priced equipment is required for the miniaturization of patterns, the integration density of the two-dimensional semiconductor devices has been increased but is still limited. Accordingly, three-dimensional semiconductor memory devices having memory cells arranged three-dimensionally have been proposed.

SUMMARY

According to an exemplary embodiment of the present disclosure, there is provided a semiconductor memory device, including a lower stacked structure extending in a first direction on a substrate and including a plurality of lower metal lines stacked in a vertical direction, an upper stacked structure disposed on the lower stacked structure and including at least one upper metal line, a vertical structure penetrating the upper and lower stacked structures in the vertical direction and including a channel layer, a first cutting line configured to cut the upper and lower stacked structures, an upper supporter disposed inside a recess formed on the first cutting line, a second cutting line configured to cut the upper and lower stacked structures and spaced apart from the first cutting line in the first direction, a sub-cutting line configured to cut the upper stacked structure while at least partially overlapping the vertical structure in the vertical direction, and disposed between the first cutting line and the second cutting line, and a first interlayer insulating layer surrounding each of a sidewall of the upper supporter and a sidewall of the sub-cutting line, wherein a top surface of the upper supporter is formed on the same plane as a top surface of the sub-cutting line.

According to an exemplary embodiment of the present disclosure, there is provided a semiconductor memory device, including a lower stacked structure extending in a first direction on a substrate and including a plurality of lower metal lines stacked in a vertical direction, an upper stacked structure disposed on the lower stacked structure and including at least one upper metal line, a vertical structure penetrating the upper and lower stacked structures in the vertical direction and including a channel layer, a first cutting line configured to cut the upper and lower stacked structures, a first upper supporter disposed on the first cutting line, a second upper supporter disposed on the first cutting line and spaced apart from the first upper supporter in a second direction different from the first direction, and a sub-cutting line configured to cut the upper stacked structure while at least partially overlapping the vertical structure in the vertical direction, and spaced apart from the first cutting line in the first direction, wherein a top surface of the first upper supporter is formed on the same plane as a top surface of the sub-cutting line.

According to an exemplary embodiment of the present disclosure, there is provided a semiconductor memory device, including a substrate, a horizontal conductive substrate disposed on the substrate, a lower stacked structure extending in a first direction on the horizontal conductive substrate and including a plurality of lower metal lines stacked in a vertical direction, an upper stacked structure disposed on the lower stacked structure and including at least one upper metal line, a vertical structure penetrating the upper and lower stacked structures in the vertical direction, including a channel layer, and electrically connected to the horizontal conductive substrate, a first cutting line configured to cut the upper and lower stacked structures, and having a first width in the first direction, a first upper supporter disposed on the first cutting line and having a second width in the first direction greater than the first width, a second upper supporter disposed on the first cutting line, having the second width in the first direction, and spaced apart from the first upper supporter in a second direction different from the first direction, a second cutting line configured to cut the upper and lower stacked structures and spaced apart from the first cutting line in the first direction, a sub-cutting line configured to cut the upper stacked structure while at least partially overlapping the vertical structure in the vertical direction, and disposed between the first cutting line and the second cutting line, a first interlayer insulating layer disposed on the vertical structure and surrounding each of a sidewall of the first cutting line, a sidewall of the second cutting line, and a sidewall of the sub-cutting line, a second interlayer insulating layer disposed on the first interlayer insulating layer and surrounding each of a sidewall of the first upper supporter and the sidewall of the sub-cutting line, and a bit line extending in the first direction on the second interlayer insulating layer, wherein a top surface of the first upper supporter is formed on the same plane as a top surface of the sub-cutting line, and wherein at least a part of a bottom surface of the first upper supporter is in contact with a top surface of the first interlayer insulating layer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
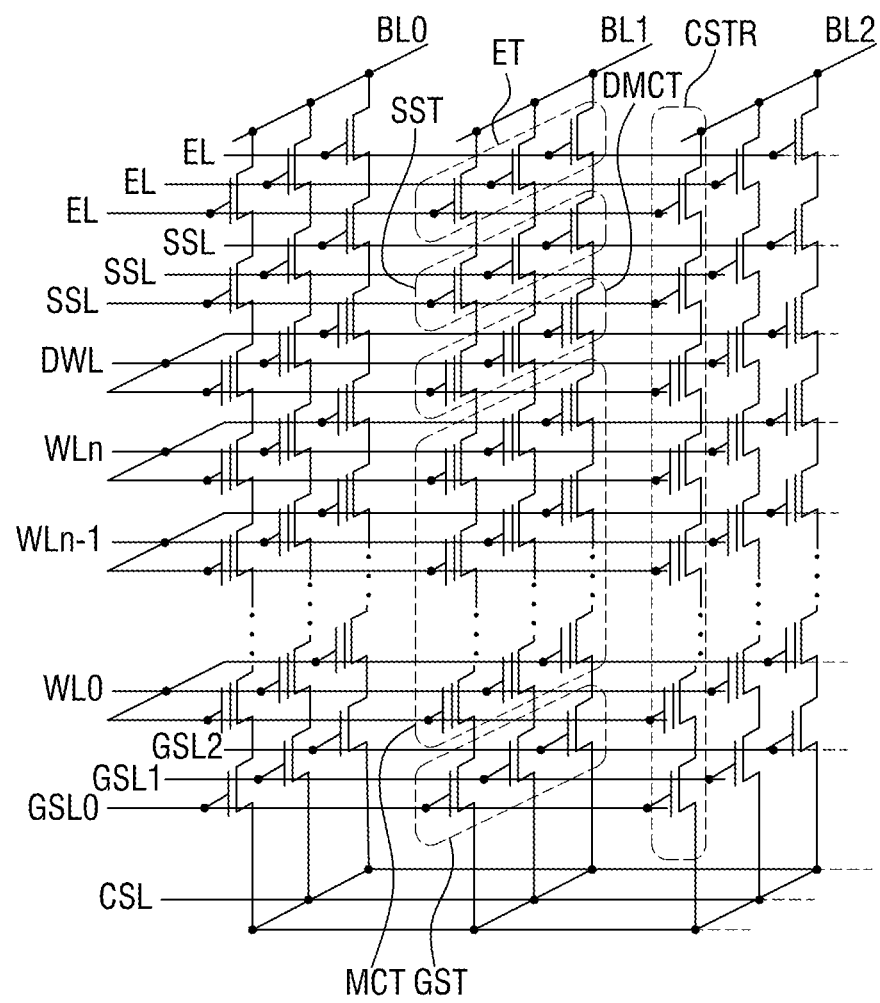
FIG. 1 is an exemplary circuit diagram of a semiconductor memory device according to some embodiments.

FIG. 1 is an exemplary circuit diagram of a semiconductor memory device according to some embodiments.

Referring to FIG. 1, a memory cell array of a semiconductor memory device according to some embodiments may include a common source line CSL, a plurality of bit lines BL0 to BL2, and a plurality of cell strings CSTR disposed between the common source line CSL and the bit lines BL0 to BL2.

The plurality of cell strings CSTR may be connected in parallel to each of the bit lines BL0 to BL2. The plurality of cell strings CSTR may be commonly connected to the common source line CSL. That is, the plurality of cell strings CSTR may be disposed between the plurality of bit lines BL0 to BL2 and one common source line CSL. A plurality of common source lines CSL may be arranged two-dimensionally. Here, the same voltage may be electrically applied to the common source lines CSL, or each of the common source lines CSL may be electrically controlled.

For example, each of the cell strings CSTR may include an erase control transistor ET, a string select transistor SST, memory cells MCT connected in series, and a ground select transistor GST. Further, each of the memory cells MCT includes a data storage element.

In one example, each of the cell strings CSTR may include the erase control transistor ET and the string select transistor SST connected in series. The erase control transistor ET may be connected to the bit lines BL0 to BL2. The ground select transistor GST may be connected to the common source lines CSL. The memory cells MCT may be connected in series between the string select transistor SST and the ground select transistor GST.

Furthermore, each of the cell strings CSTR may further include a dummy cell DMCT connected between the string select transistor SST and the memory cell MCT. Although not illustrated in the drawings, the dummy cell DMCT may also be connected between the ground select transistor GST and the memory cell MCT. In another example, in each of the cell strings CSTR, the ground select transistor GST may include a plurality of MOS transistors connected in series. In another example, each of the cell strings CSTR may include a plurality of string select transistors connected in series.

In accordance with some embodiments, the erase control transistor ET may be controlled by an erase control line EL, and the string select transistor SST may be controlled by a string select line SSL. The memory cells MCT may be controlled by a plurality of word lines $WL_0$ to $WL_n$, and the dummy cells DMCT may be controlled by a dummy word line DWL. Further, the ground select transistor GST may be controlled by a ground select line GSL. The common source line CSL may be commonly connected to the sources of the ground select transistors GST.

One cell string CSTR may include a plurality of memory cells MCT with different distances from the common source lines CSL. Further, the plurality of word lines $WL_0$ to $WL_n$ and DWL may be arranged between the common source lines CSL and the bit lines BL0 to BL2.

The gate electrodes of the memory cells MCT, which are located at substantially the same distance from the common source lines CSL, may be commonly connected to one of the word lines $WL_0$ to $WL_n$ and DWL and be in an equipotential state. On the other hand, even if the gate electrodes of the memory cells MCT are located at substantially the same level from the common source lines CSL, the gate electrodes located in different rows or different columns may be controlled independently.

For example, the ground select lines GSL0 to GSL2 and the string select line SSL may extend in the same direction as the extension direction of the word lines $WL_0$ to $WL_n$ and DWL. The ground select lines GSL0 to GSL2 and the string select line SSL, which are located at substantially the same level from the common source lines CSL, may be electrically separated from each other.

Further, the erase control lines EL located at substantially the same level from the common source lines CSL may be electrically separated from each other. On the other hand, although not illustrated in the drawings, the erase control transistors ET of different cell strings CTSR may be controlled by the common erase control line EL. The erase control transistors ET generate gate induced drain leakage (GIDL) during the erase operation of the memory cell array. In other words, the erase control transistors ET may be GIDL transistors.

Hereinafter, a semiconductor memory device according to some embodiments of the present disclosure will be described with reference to FIGS. 2 to 7.

Figure 2:
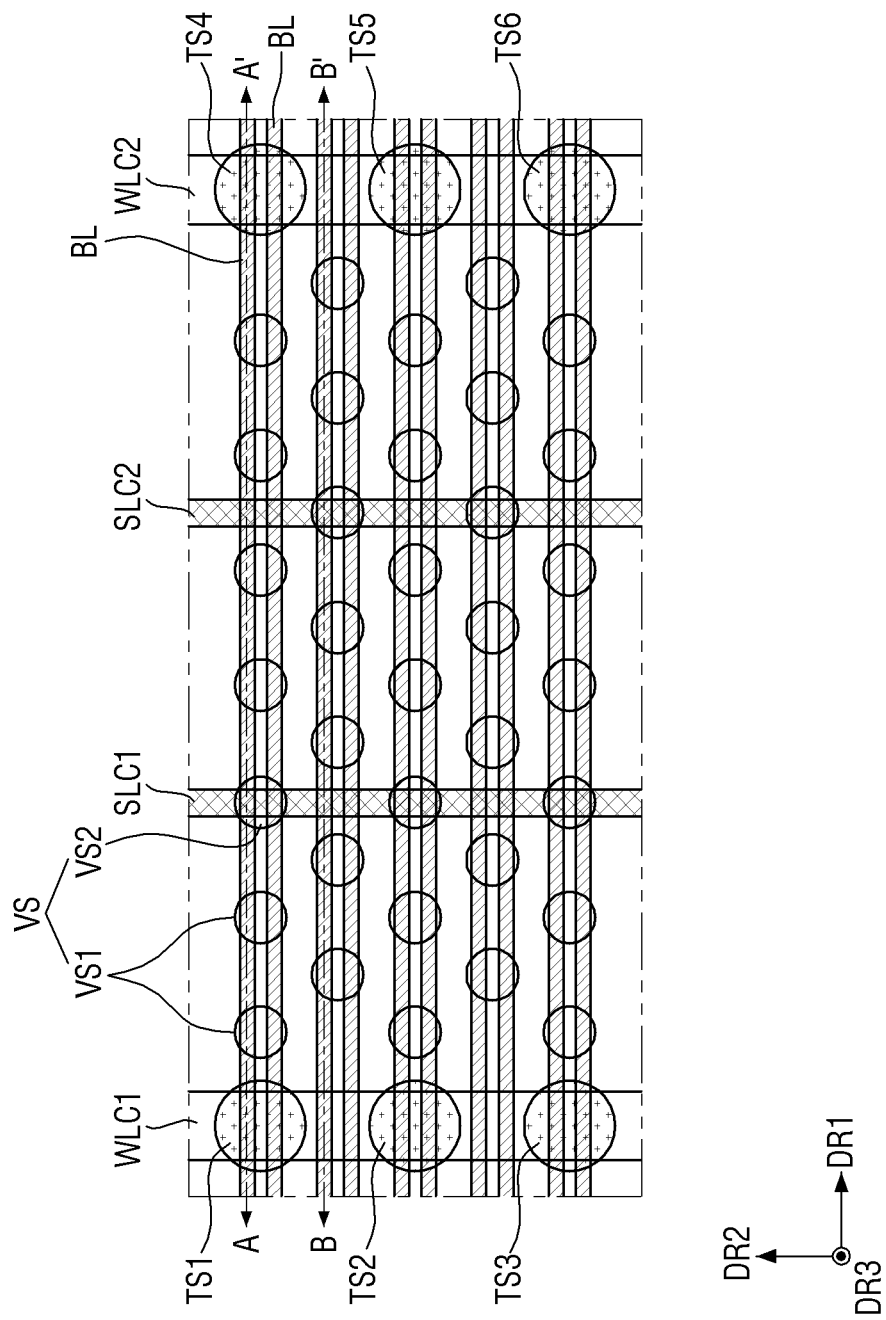
FIG. 2 is a layout view of a semiconductor memory device according to some embodiments of the present disclosure.
Figure 3:
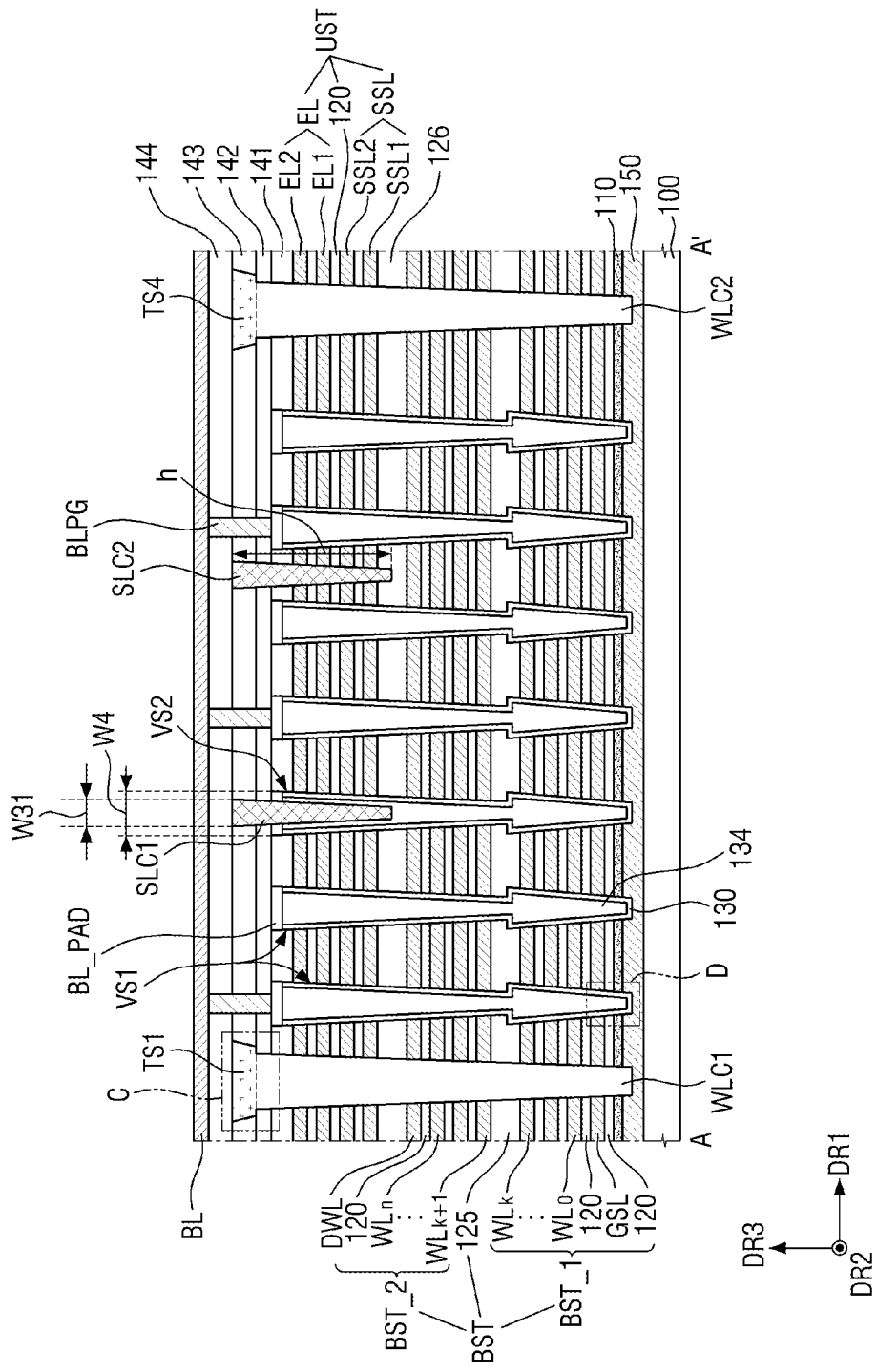
FIG. 3 is a cross-sectional view taken along line A-A' of FIG. 2.
Figure 4:
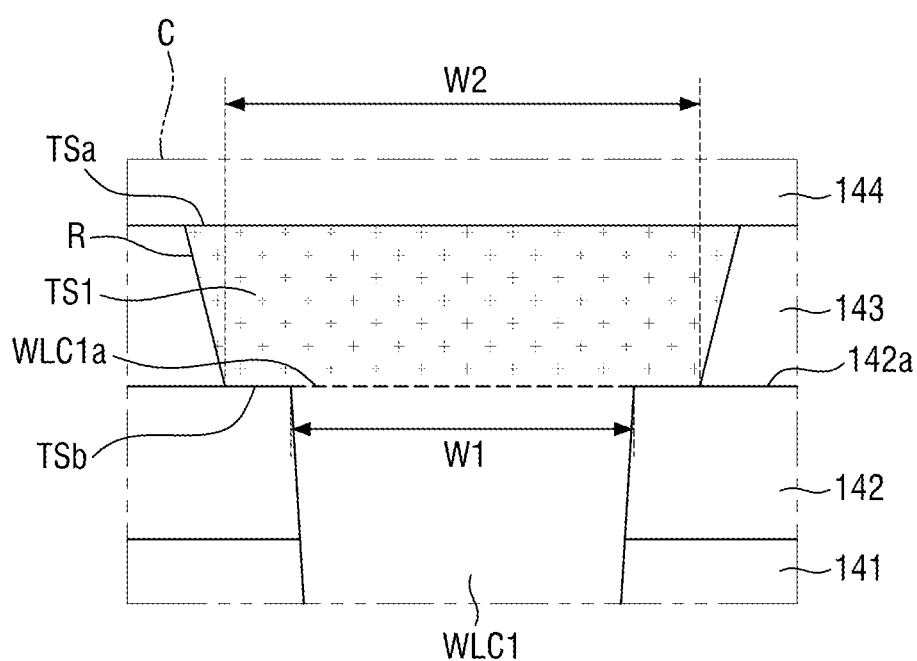
FIG. 4 is an enlarged view of area C of FIG. 3.
Figure 5:
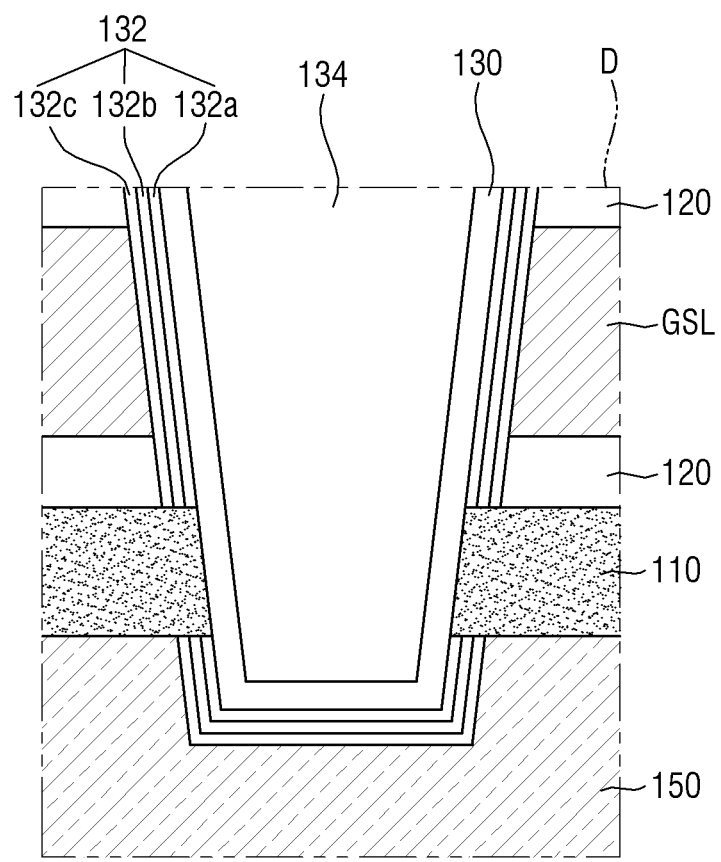
FIGS. 5 and 6 are enlarged views of area D of FIG. 3.
Figure 6:
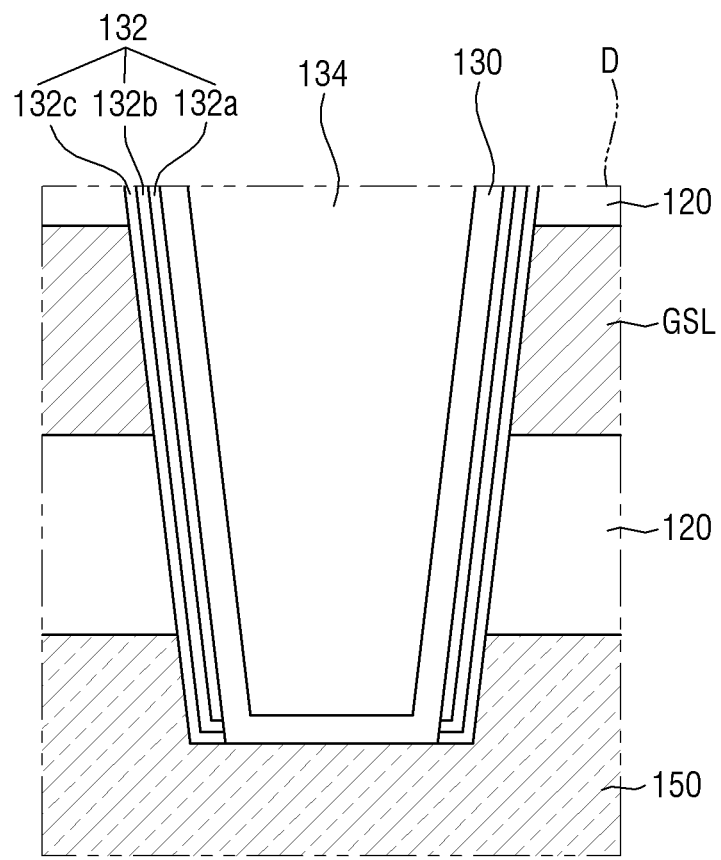
Figure 7:
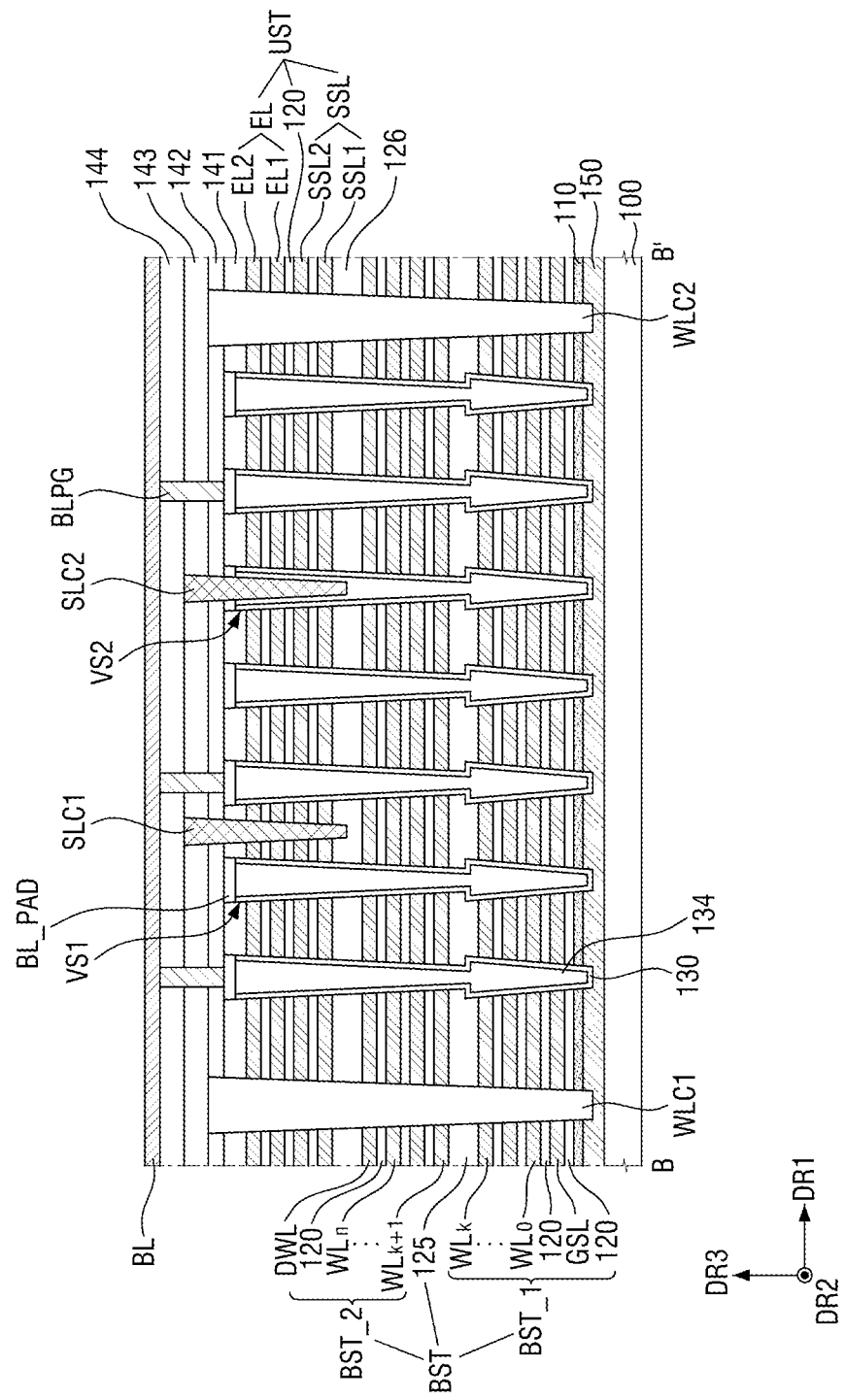
FIG. 7 is a cross-sectional view taken along line B-B' of FIG. 2.

FIG. 2 is a layout view of a semiconductor memory device according to some embodiments of the present disclosure. FIG. 3 is a cross-sectional view along line A-A' of FIG. 2. FIG. 4 is an enlarged view of area C of FIG. 3. FIGS. 5 and 6 are enlarged views of area D of FIG. 3. FIG. 7 is a cross-sectional view along line B-B' of FIG. 2.

Referring to FIGS. 2 to 7, the semiconductor memory device according to some embodiments of the present disclosure may include a substrate 100, a horizontal conductive substrate 150, a vertical structure support layer 110, a lower stacked structure BST, an inter-structure insulating layer 126, an upper stacked structure UST, first to fourth interlayer insulating layers 141, 142, 143, and 144, a first cutting line WLC1, a second cutting line WLC2, a first sub-cutting line SLC1, a second sub-cutting line SLC2, a vertical structure VS, first to sixth upper supporters TS1, TS2, TS3, TS4, TS5, and TS6, a bit line plug BLPG, and a bit line BL.

For example, the substrate 100 may include at least one of a silicon substrate, a silicon germanium substrate, a germanium substrate, a silicon germanium-on-insulator (SGOI) substrate, a silicon-on-insulator (SOI) substrate, and a germanium-on-insulator (GOI) substrate. In another example, the substrate 100 may include a semiconductor material, e.g., indium antimonide, lead tellurium compound, indium arsenic, indium phosphide, gallium arsenide, or gallium antimonide, but is not limited thereto.

The horizontal conductive substrate 150 may be disposed on the substrate 100. The horizontal conductive substrate 150 may be a common source plate. That is, the horizontal conductive substrate 150 may serve as the common source line CSL in FIG. 1.

The horizontal conductive substrate 150 may include at least one of a conductive semiconductor layer, a metal silicide layer, or a metal layer. When the horizontal conductive substrate 150 includes a conductive semiconductor layer, the horizontal conductive substrate 150 may include, e.g., at least one of silicon (Si), germanium (Ge), silicon germanium (SiGe), gallium arsenide (GaAs), indium gallium arsenic (InGaAs), aluminum gallium arsenide (AlGaAs), or a combination thereof. The horizontal conductive substrate 150 may have a crystal structure including at least one of, e.g., monocrystal, amorphous, and polycrystal structures. The horizontal conductive substrate 150 may include at least one of, e.g., p-type impurities, n-type impurities, and carbon included in the semiconductor layer.

The lower stacked structure BST may extend in a first direction DR1 on the substrate 100. The lower stacked structure BST may be disposed on the horizontal conductive substrate 150. The lower stacked structure BST may include a plurality of lower metal lines GSL, $WL_0$ to $WL_n$, and DWL, and a plurality of first and second inter-electrode insulating layers 120 and 125 that are stacked in a vertical direction DR3. The first and the second inter-electrode insulating layers 120 and 125 may be disposed, e.g., alternately, between the lower metal lines GSL, $WL_0$ to $WL_n$, and DWL that are spaced apart from each other in the vertical direction DR3.

The plurality of lower metal lines GSL, $WL_0$ to $WL_n$, and DWL may include the ground select line GSL, the plurality of word lines $WL_0$ to $WL_n$, and the dummy word line DWL. The ground select line GSL, the plurality of word lines $WL_0$ to $WL_n$, and the dummy word line DWL may be sequentially stacked on the substrate 100.

Although it is illustrated in FIG. 3 that only six word lines $WL_0$ to $WL_n$ are stacked on the ground select line GSL, this is only for simplicity of description and the present disclosure is not limited thereto. Further, although it is illustrated that the lower metal line disposed at the uppermost portion of the lower stacked structure BST is the dummy word line DWL, the present disclosure is not limited thereto. The lower metal line disposed at the uppermost portion of the lower stacked structure BST may be the word line $WL_n$.

The lower stacked structure BST may include a first sub-lower stacked structure BST_1 and a second sub-lower stacked structure BST_2 disposed on the first sub-lower stacked structure BST_1. The first sub-lower stacked structure BST_1 may include the ground select line GSL and a first portion of the word lines $WL_0$ to $WL_k$. The second sub-lower stacked structure BST_2 may include a second portion, i.e., the other remaining, word lines $WL_{k+1}$ to $WL_n$ and the dummy word line DWL. Here, n is a natural number greater than k.

The second inter-electrode insulating layer 125 may be disposed between the word line $WL_k$ located at the uppermost portion of the first sub-lower stacked structure BST_1 and the word line $WL_{k+1}$ located at the lowermost portion of the second sub-lower stacked structure BST_2. The second inter-electrode insulating layer 125 may have a thickness greater than the thickness of, e.g., each of, the first inter-electrode insulating layer 120 in the first sub-lower stacked structure BST_1 and the second sub-lower stacked structure BST_2.

The upper stacked structure UST may be disposed on the lower stacked structure BST, i.e., on the second sub-lower stacked structure BST_2. The upper stacked structure UST may include a first upper metal line SSL and a second upper metal line EL stacked in the vertical direction DR3. The first upper metal line SSL may be closer to the substrate 100 than the second upper metal line EL is, e.g., the first upper metal line SSL may be between the substrate 100 and the second upper metal line EL. The upper stacked structure UST may include one of the first inter-electrode insulating layers 120 disposed between the first upper metal line SSL and the second upper metal line EL.

The first upper metal line SSL may include a first sub-upper metal line SSL1 and a second sub-upper metal line SSL2 disposed on the first sub-upper metal line SSL1. One of the first inter-electrode insulating layers 120 may be disposed between the first sub-upper metal line SSL1 and the second sub-upper metal line SSL2.

The second upper metal line EL may include a third sub-upper metal line EL1 and a fourth sub-upper metal line EL2 disposed on the third sub-upper metal line EL1. One of the first inter-electrode insulating layer 120 may be disposed between the third sub-upper metal line EL1 and the fourth sub-upper metal line EL2.

The first upper metal line SSL may serve as the string select line of FIG. 1, and the second upper metal line EL may serve as the erase control line of FIG. 1. The first upper metal line SSL may be included in the string select transistor of FIG. 1, and the second upper metal line EL may be included in the erase control transistor ET of FIG. 1.

The inter-structure insulating layer 126 may be disposed between the bottom surface of the first upper metal line SSL and the top surface of the dummy word line DWL. The inter-structure insulating layer 126 may have a thickness greater than the thickness of, e.g., each of, the first inter-electrode insulating layers 120 in the first sub-lower stacked structure BST_1 and the second sub-lower stacked structure BST_2.

The lower metal lines GSL, $WL_0$ to $WL_n$, and DWL, the first upper metal line SSL, and the second upper metal line EL may contain the same material. For example, the lower metal lines GSL, $WL_0$ to $WL_n$, and DWL, the first upper metal line SSL, and the second upper metal line EL may have the same conductive layer stacked structure.

For example, each of the lower metal lines GSL, $WL_0$ to $WL_n$, and DWL, the first upper metal line SSL, and the second upper metal line EL may include a barrier conductive layer and a filling conductive layer surrounded by the barrier conductive layer. The barrier conductive layer may contain at least one of a metal, metal nitride, metal carbonitride, or a two-dimensional (2D) material. For example, the two-dimensional material may be a metallic material and/or a semiconductor material. The two-dimensional material may include a two-dimensional allotrope or a two-dimensional compound. The filling conductive layer may contain a metal such as tungsten (W), cobalt (Co), nickel (Ni), or the like. However, the present disclosure is not limited thereto.

The first and the second inter-electrode insulating layers 120 and 125, and the inter-structure insulating layer 126 may contain, e.g., silicon oxide. However, the present disclosure is not limited thereto.

The first cutting line WLC1 and the second cutting line WLC2 may be disposed in the upper stacked structure UST and the lower stacked structure BST, e.g., as continuous separators in the second and third directions DR2 and DR3 (FIGS. 2-3) through both the lower and upper stacked structures BST and UST. The first cutting line WLC1 and the second cutting line WLC2 may, e.g., continuously, penetrate the upper stacked structure UST and the lower stacked structure BST. The first cutting line WLC1 and the second cutting line WLC2 may extend in a second direction DR2 different from the first direction DR1 to cut the upper stacked structure UST and the lower stacked structure BST. The second cutting line WLC2 may be spaced apart from the first cutting line WLC1 in the first direction DR1. The first cutting line WLC1 and the second cutting line WLC2 may cut the lower conductive lines GSL, $WL_0$ to $WL_n$, and DWL, the first upper conductive line SSL, and the second upper conductive line EL.

Each of the first cutting line WLC1 and the second cutting line WLC2 may contain an insulating material. Each of the first cutting line WLC1 and the second cutting line WLC2 may contain, e.g., at least one of silicon oxide, silicon nitride, silicon nitride, or a low dielectric constant material. The low dielectric constant material may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), Tonen Silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but the present disclosure is not limited thereto.

A vertical structure VS may be disposed between the first cutting line WLC1 and the second cutting line WLC2. The vertical structure VS may extend in the vertical direction DR3. The vertical structure VS may, e.g., continuously, penetrate the upper stacked structure UST and the lower stacked structure BST. At least a part of the vertical structure VS may extend into the horizontal conductive substrate 150.

The vertical structure VS may include a first portion disposed in the upper stacked structure UST and the second sub-lower stacked structure BST_2, and a second portion disposed in the lower stacked structure BST. The width of the bottom surface of the first portion of the vertical structure VS in the first direction DR1 may be smaller than the width of the top surface of the second portion of the vertical structure VS in the first direction DR1.

The vertical structure VS may include a first vertical structure VS1 and a second vertical structure VS2. The first vertical structure VS1 may be connected to the bit line BL through the bit line plug BLPG. The second vertical structure VS2 may not be connected to the bit line BL. In other words, the second vertical structure VS2 may be a dummy vertical structure. The second vertical structure VS2 may overlap one of the first sub-cutting line SLC1 and the second sub-cutting line SLC2 in the vertical direction DR3.

For example, as illustrated in FIG. 2, seven vertical structures VS spaced apart from each other in the first direction DR1 may be disposed between the first cutting line WLC1 and the second cutting line WLC2. For example, two first vertical structures VS1 aligned in the first direction DR1 may be disposed between the first cutting line WLC1 and the first sub-cutting line SLC1, e.g., each of these two first vertical structures VS1 may be connected to a different bit line BL as will be discussed in detail below (only one of the bit lines BL is illustrated in FIG. 3). One second vertical structure VS2 overlapping the first sub-cutting line SLC1 in the vertical direction DR3 may be disposed. Two first vertical structures VS1 aligned in the first direction DR1 may be disposed between the first sub-cutting line SLC1 and the second sub-cutting line SLC2. Two first vertical structures VS1 aligned in the first direction DR1 may be disposed between the second sub-cutting line SLC2 and the second cutting line WLC2.

As shown in FIGS. 3 and 5, the vertical structure VS may include a channel layer 130 extending in the vertical direction DR3, a channel insulating layer 132, and an insulating pattern 134.

The channel layer 130 may be disposed along the sidewall and the bottom surface of the vertical structure VS. The channel layer 130 may be electrically connected to the horizontal conductive substrate 150 serving as the common source line.

For example, the channel layer 130 may include a semiconductor material such as silicon (Si), germanium (Ge), or a mixture thereof. In another example, the channel layer 130 may include a semiconductor material such as a metal oxide semiconductor material, an organic semiconductor material, and a carbon nanostructure. In the semiconductor memory device according to some embodiments, the channel layer 130 may include polycrystalline silicon.

The insulating pattern 134 may be disposed on the channel layer 130. The insulating pattern 134 may include, e.g., at least one of silicon oxide, silicon oxynitride, or a low dielectric constant material, but the present disclosure is not limited thereto.

The channel insulating layer 132 may be disposed between the channel layer 130 and the upper stacked structure UST, between the channel layer 130 and the lower stacked structure BST, and between the channel layer 130 and the horizontal conductive substrate 150. The channel insulating layer 132 may include, e.g., a tunnel insulating layer 132a, a charge storage layer 132b, and a blocking insulating layer 132c that are sequentially disposed on the channel layer 130. The tunnel insulating layer 132a, the charge storage layer 132b, and the blocking insulating layer 132c are merely examples, and the present disclosure is not limited thereto.

The tunnel insulating layer 132a may include, e.g., silicon oxide or a high dielectric constant material (e.g., aluminum oxide ($Al_2O_3$), and hafnium oxide ($HfO_2$)). The charge storage layer 132b may include, e.g., silicon nitride. The blocking insulating layer 132c may include, e.g., silicon oxide or a high dielectric constant material (e.g., aluminum oxide ($Al_2O_3$), and hafnium oxide ($HfO_2$)). In some other embodiments, the tunnel insulating layer 132a and the blocking insulating layer 132c may include silicon oxide.

The tunnel insulating layer 132a, the charge storage layer 132b, and the blocking insulating layer 132c may be separated below the channel layer 130. The tunnel insulating layer 132a, the charge storage layer 132b, and the blocking insulating layer 132c that are separated may expose a part of the channel layer 130. The vertical structure support layer 110 may be disposed between the tunnel insulating layer 132a, the charge storage layer 132b, and the blocking insulating layer 132c that are separated. The vertical structure support layer 110 may electrically connect the horizontal conductive substrate 150 to the channel layer 130. The vertical structure support layer 110 may include, e.g., a semiconductor material such as silicon (Si), germanium (Ge), or a mixture thereof.

In some other embodiments, as shown in FIG. 6, the vertical structure support layer 110 may not be disposed between the horizontal conductive substrate 150 and the lower stacked structure BST. In this case, the sidewall portion of the channel layer 130 may not be exposed, and the bottom portion of the channel layer 130 may be exposed. The tunnel insulating layer 132a, the charge storage layer 132b, and the blocking insulating layer 132c disposed between the bottom portion of the channel layer 130 and the horizontal conductive substrate 150 may be removed. The channel layer 130 may be electrically connected to the horizontal conductive substrate 150 through the bottom portion of the channel layer 130.

As illustrated in FIG. 3, a bit line pad BL_PAD may be disposed on the vertical structure VS. The bit line pad BL_PAD may be in contact with each of the channel layer 130, the channel insulating layer 132, and the insulating pattern 134. The bit line pad BL_PAD may contain a conductive material. For example, the bit line pad BL_PAD may contain a semiconductor material doped with n-type impurities.

The first to fourth interlayer insulating layers 141, 142, 143, and 144 may be sequentially disposed on the upper stacked structure UST. The bit line pad BL_PAD may be disposed in the first interlayer insulating layer 141. The first cutting line WLC1 and the second cutting line WLC2 may penetrate the first interlayer insulating layer 141 and the second interlayer insulating layer 142.

The second interlayer insulating layer 142 may surround, e.g., perimeters of, the sidewall of the first cutting line WLC1, the sidewall of the second cutting line WLC2, the sidewall of the first sub-cutting line SLC1, and the sidewall of the second sub-cutting line SLC2. The third interlayer insulating layer 143 may surround, e.g., perimeters of, the sidewalls of the plurality of upper supporters TS1, TS2, TS3, TS4, TS5, and TS6, the sidewall of the first sub-cutting line SLC1, and the sidewall of the second sub-cutting line SLC2. The fourth interlayer insulating layer 144 may be disposed between each of the plurality of upper supporters TS1, TS2, TS3, TS4, TS5, and TS6 and the bit line BL.

Each of the first to fourth interlayer insulating layers 141, 142, 143, and 144 may contain, e.g., at least one of silicon oxide, silicon oxynitride, or a low dielectric constant material. However, the present disclosure is not limited thereto.

The bit line plug BLPG may be disposed on the first vertical structure VS1. The bit line plug BLPG is not disposed on the second vertical structure VS2. The bit line plug BLPG may penetrate the second to fourth interlayer insulating layers 142, 143, and 144.

The bit line BL may be disposed on the upper stacked structure UST. The bit line BL may be elongated in the first direction DR1. The bit line BL may be electrically connected to at least one of the channel layers 130. The bit line BL may be disposed on the fourth interlayer insulating layer 144. The bit line BL may be electrically connected to the bit line pad BL_PAD through the bit line plug BLPG. Each of the bit line BL and the bit line plug BLPG may contain a conductive material.

Referring to FIG. 2, two bit lines BL may overlap in the third direction DR3 each of the plurality of vertical structures VS spaced apart from each other in the first direction DR1. In this case, the two bit lines BL disposed on the plurality of vertical structures VS spaced apart from each other in the first direction DR1 may be spaced apart from each other in the second direction DR2. For example, referring to FIG. 2, the top row of the of vertical structures VS that extends in the first direction DR1 may be overlapped by two bit lines BL (two hatched lines that extend in the first direction DR1) that are spaced apart from each other in the second direction DR2, e.g., so a distance in the second direction DR2 between two adjacent bit lines BL overlapping a same row of vertical structures VS may be smaller than a distance in the second direction DR2 between two adjacent bit lines BL overlapping different rows of vertical structures VS.

One of the two bit lines BL disposed to overlap a same row of vertical structures VS may be connected to a first portion of the plurality of vertical structures VS1 through the bit line plug BLPG, e.g., to three of the vertical structures VS1 out of the six vertical structures VS1 illustrated in FIG. 3. The other one of the two bit lines BL disposed on the plurality of vertical structures VS spaced apart from each other in the first direction DR1 (i.e., the other of the two bit lines BL overlapping the same row of vertical structures VS) may be connected to the remaining part of the plurality of vertical structures VS1 through the bit line plug BLPG, e.g., to the other three of the vertical structures VS1 out of the six vertical structures VS1.

The plurality of upper supporters TS1, TS2, TS3, TS4, TS5, and TS6 may be disposed on the first cutting line WLC1 and the second cutting line WLC2. The plurality of upper supporters TS1, TS2, TS3, TS4, TS5, and TS6 may be disposed in recesses R formed on the first cutting line WLC1 and the second cutting line WLC2. Each of the plurality of upper supporters TS1, TS2, TS3, TS4, TS5, and TS6 may be disposed in the third interlayer insulating layer 143. In other words, the recesses R may be formed in the third interlayer insulating layer 143.

For example, the first to third upper supporters TS1, TS2, and TS3 may be disposed on the first cutting line WLC1. The first to third upper supporters TS1, TS2, and TS3 may be spaced apart from each other in the second direction DR2. Although it is illustrated in FIG. 2 that each of the first to third upper supporters TS1, TS2, and TS3 overlaps the bit line BL in the vertical direction DR3, the present disclosure is not limited thereto.

The fourth to sixth upper supporters TS4, TS5, and TS6 may be disposed on the second cutting line WLC2. The fourth to sixth upper supporters TS4, TS5, and TS6 may be spaced apart from each other in the second direction DR2. Although it is illustrated in FIG. 2 that each of the fourth to sixth upper supporters TS4, TS5, and TS6 overlaps the bit line BL in the vertical direction DR3, the present disclosure is not limited thereto.

Although it is illustrated in FIG. 2 that each of the plurality of upper supporters TS1, TS2, TS3, TS4, TS5, and TS6 has a circular planar shape, e.g., as viewed in a top view, the shapes of the plurality of upper supporters TS1, TS2, TS3, TS4, TS5, and TS6 are not limited thereto. The first to sixth upper supporters TS2, TS3, TS4, TS5, and TS6 may have same structures, and therefore, only the first upper supporter TS1 will be described hereinafter.

As illustrated in FIGS. 3 and 4, a top surface TSa of the first upper supporter TS1 may be formed on the same plane, e.g., coplanar, as the top surface of the third interlayer insulating layer 143, e.g., the top surface TSa of the first upper supporter TS1 may be level with the top surface of the third interlayer insulating layer 143. A first width W1 of a top surface WLC1a of the first cutting line WLC1 in the first direction DR1 may be smaller than a second width W2 of a bottom surface TSb of the first upper supporter TS1 in the first direction DR1. At least a part of the bottom surface TSb of the first upper supporter TS1 may be in contact with the top surface 142a of the second interlayer insulating layer 142, e.g., the bottom surface TSb of the first upper supporter TS1 may extend beyond the top surface WLC1a of the first cutting line WLC1 to overhang the first cutting line WLC1.

The first upper supporter TS1 may contain an insulating material. The first upper supporter TS1 may contain the same material as that of the first cutting line WLC1. However, the present disclosure is not limited thereto. The first upper supporter TS1 may include, e.g., at least one of silicon oxide, silicon nitride, silicon oxynitride, or a low dielectric constant material.

The first sub-cutting line SLC1 and the second sub-cutting line SLC2 may be disposed between the first cutting line WLC1 and the second cutting line WLC2, e.g., as continuous separators in the second and third directions DR2 and DR3 within the upper stacked structure UST. The first cutting line WLC1, the first sub-cutting line SLC1, the second sub-cutting line SLC2, and the second cutting line WLC2 may be sequentially spaced apart from each other in the first direction DR1. Each of the first sub-cutting line SLC1 and the second sub-cutting line SLC2 may extend in the second direction DR2.

For example, as illustrated in FIG. 2, two first vertical structures VS1 spaced apart from each other in the first direction DR1 may be disposed between the first cutting line WLC1 and the first sub-cutting line SLC1, between the first sub-cutting line SLC1 and the second sub-cutting line SLC2, and between the second sub-cutting line SLC2 and the second cutting line WLC2. However, the present disclosure is not limited thereto.

Each of the first sub-cutting line SLC1 and the second sub-cutting line SLC2 may cut, e.g., only, the upper stacked structure UST and the first to third interlayer insulating layers 141, 142, and 143. For example, as illustrated in FIG. 3, the first sub-cutting line SLC1 and the second sub-cutting line SLC2 may not extend in the third direction DR3 beyond the inter-structure insulating layer 126, e.g., so the first and second first sub-cutting lines SLC1 and SLC2 may have a shorter height h than those of the first and second cutting line WLC1 and WLC2 in the third direction DR3.

At least a part of the first sub-cutting line SLC1 may extend into the second vertical structure VS2. In other words, at least a part of the first sub-cutting line SLC1 may overlap the second vertical structure VS2 in the vertical direction DR3. At least a part of the second sub-cutting line SLC2 may extend into the second vertical structure VS2. In other words, at least a part of the second sub-cutting line SLC2 may overlap the second vertical structure VS2 in the vertical direction DR3. The second vertical structure VS2 overlapping the first sub-cutting line SLC1 in the vertical direction DR3 is different from the second vertical structure VS2 overlapping the second sub-cutting line SLC2 in the vertical direction DR3.

The bottom surface of the first sub-cutting line SLC1 may be formed between the lower stacked structure BST and the upper stacked structure UST. In other words, the bottom surface of the first sub-cutting line SLC1 may be formed in the inter-structure insulating layer 126. However, the present disclosure is not limited thereto.

The top surface of the first sub-cutting line SLC1 may be formed on the same plane, e.g., coplanar, as the top surface TSa of the first upper supporter TS1. In other words, the top surface of the first sub-cutting line SLC1, the top surface TSa of the first upper supporter TS1, and the top surface of the third interlayer insulating layer 143 may be formed on the same plane, e.g., level with each other.

A third width W31 of the top surface of the first sub-cutting line SLC1 in the first direction DR1 may be smaller than a fourth width W4 of the uppermost surface of the second vertical structure VS2 in the first direction DR1. The first sub-cutting line SLC1 may be spaced apart from, e.g., the channel layer 130. However, the present disclosure is not limited thereto.

The height h of the first sub-cutting line SLC1 in the vertical direction DR3 may be, e.g., 5000 angstroms to 10000 angstroms. The height h of the first sub-cutting line SLC1 in the vertical direction DR3 may allow the upper stacked structure UST to be completely separated in the vertical direction DR3.

The semiconductor memory device according to some embodiments of the present disclosure can reduce a manufacturing cost by lowering a level of difficulty of processing by forming the dummy vertical structure VS2 and the word line, and only then forming the sub-cutting lines SLC1 and SLC2 to overlap the dummy vertical structure VS2 in the vertical direction DR3. In the case of manufacturing the semiconductor memory device through these steps, the top surfaces of the sub-cutting lines SLC1 and SLC2 may be formed on the same plane as the top surface of the upper supporter TS1 formed on the cutting line WLC1.

Hereinafter, a semiconductor memory device according to still other embodiments of the present disclosure will be described with reference to FIG. 8. Differences from the semiconductor memory device shown in FIGS. 2 to 7 will be mainly described.

Figure 8:
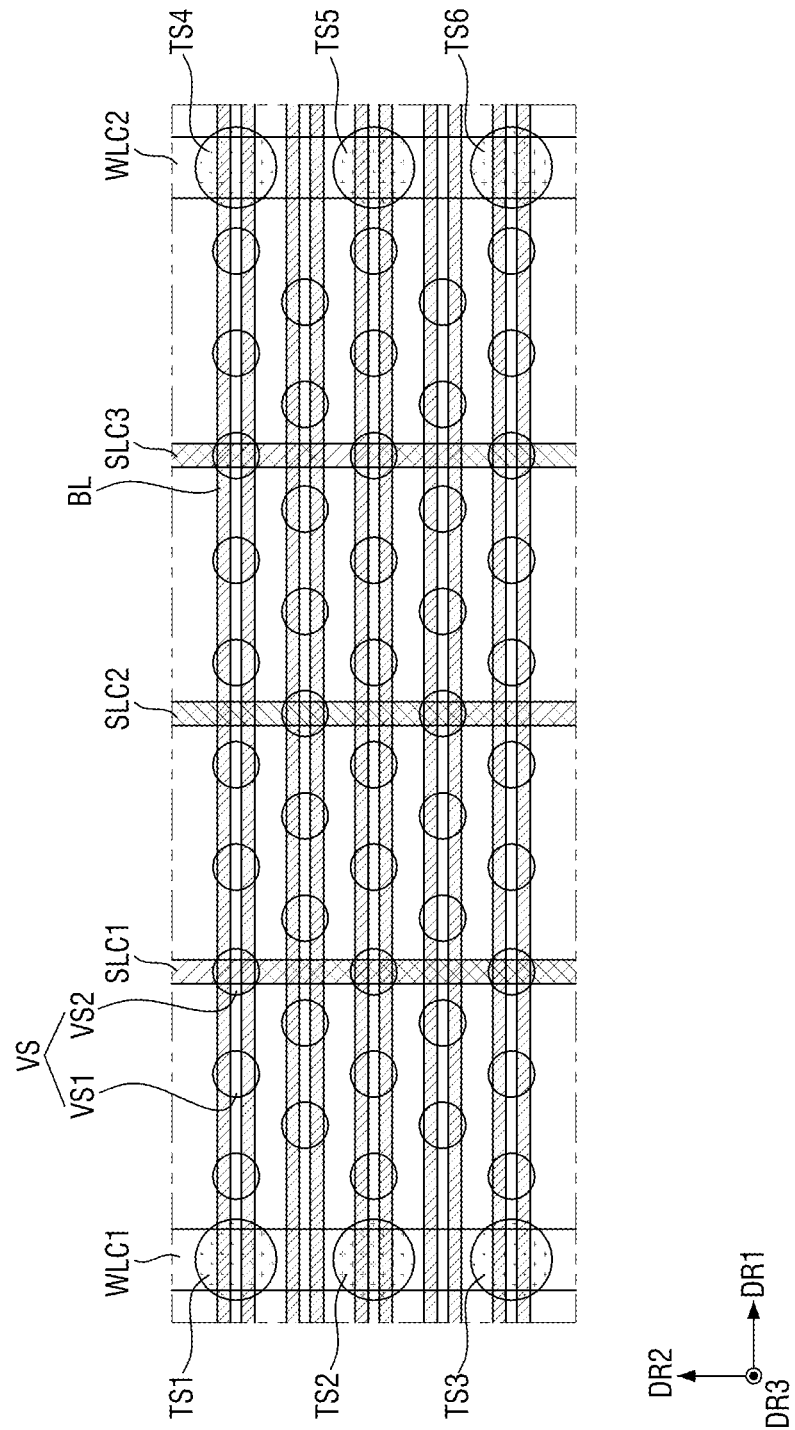
FIG. 8 is a layout view of a semiconductor memory device according to some other embodiments of the present disclosure.

FIG. 8 is a layout view of a semiconductor memory device according to some other embodiments of the present disclosure.

Referring to FIG. 8, in the semiconductor memory device according to some other embodiments of the present disclosure, first to third sub-cutting lines SLC1, SLC2, and SLC3 may be disposed between the first cutting line WLC1 and the second cutting line WLC2 adjacent to each other.

The first cutting line WLC1, the first sub-cutting line SLC1, the second sub-cutting line SLC2, the third sub-cutting line SLC3, and the second cutting line WLC2 may be sequentially spaced apart from each other in the first direction DR1. Each of the first to third sub-cutting lines SLC1, SLC2, and SLC3 may extend in the second direction DR2.

Ten vertical structures VS spaced apart from each other in the first direction DR1 may be disposed between the first cutting line WLC1 and the second cutting line WLC2. For example, two first vertical structures VS1 aligned in the first direction DR1 may be disposed between the first cutting line WLC1 and the first sub-cutting line SLC1. One second vertical structure VS2 overlapping the first sub-cutting line SLC1 in the vertical direction DR3 may be disposed. Two first vertical structures VS1 aligned in the first direction DR1 may be disposed between the first sub-cutting line SLC1 and the second sub-cutting line SLC2. Two first vertical structures VS1 aligned in the first direction DR1 may be disposed between the second sub-cutting line SLC2 and the third sub-cutting line SLC3. One second vertical structure VS2 overlapping the third sub-cutting line SLC3 in the vertical direction DR3 may be disposed. Two first vertical structures VS1 aligned in the first direction DR1 may be disposed between the third sub-cutting line SLC3 and the second cutting line WLC2.

Hereinafter, a semiconductor memory device according to still other embodiments of the present disclosure will be described with reference to FIG. 9. Differences from the semiconductor memory device shown in FIGS. 2 to 7 will be mainly described.

Figure 9:
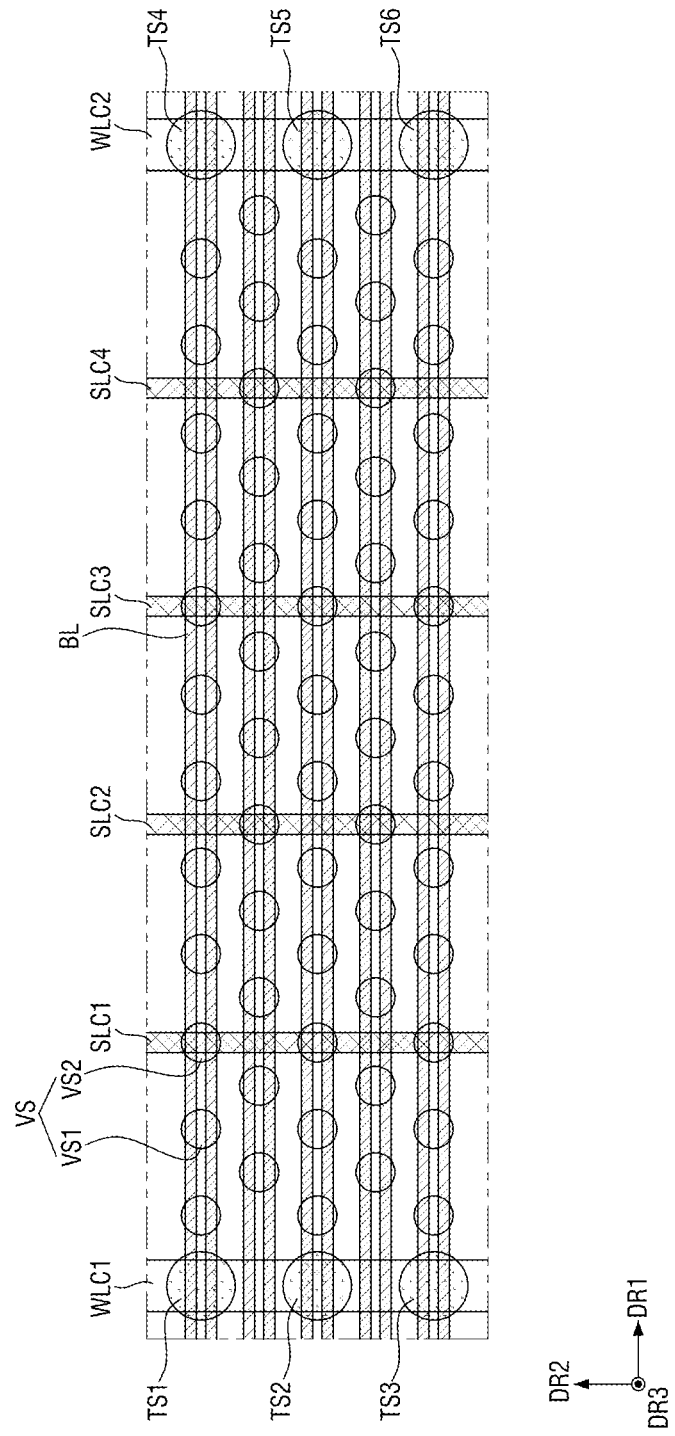
FIG. 9 is a layout view of a semiconductor memory device according to some other embodiments of the present disclosure.

FIG. 9 is a layout view of a semiconductor memory device according to some other embodiments of the present disclosure.

Referring to FIG. 9, in the semiconductor memory device according to some other embodiments of the present disclosure, first to fourth sub-cutting lines SLC1, SLC2, SLC3, and SLC4 may be disposed between the first cutting line WLC1 and the second cutting line WLC2 adjacent to each other.

The first cutting line WLC1, the first sub-cutting line SLC1, the second sub-cutting line SLC2, the third sub-cutting line SLC3, the fourth sub-cutting line SLC4, and the second cutting line WLC2 may be sequentially spaced apart from each other in the first direction DR1. Each of the first to fourth sub-cutting lines SLC1, SLC2, SLC3, and SLC4 may extend in the second direction DR2.

Twelve vertical structures VS spaced apart from each other in the first direction DR1 may be disposed between the first cutting line WLC1 and the second cutting line WLC2. For example, two first vertical structures VS1 aligned in the first direction DR1 may be disposed between the first cutting line WLC1 and the first sub-cutting line SLC1. One second vertical structure VS2 overlapping the first sub-cutting line SLC1 in the vertical direction DR3 may be disposed. Two first vertical structures VS1 aligned in the first direction DR1 may be disposed between the first sub-cutting line SLC1 and the second sub-cutting line SLC2. Two first vertical structures VS1 aligned in the first direction DR1 may be disposed between the second sub-cutting line SLC2 and the third sub-cutting line SLC3. One second vertical structure VS2 overlapping the third sub-cutting line SLC3 in the vertical direction DR3 may be disposed. Two first vertical structures VS1 aligned in the first direction DR1 may be disposed between the third sub-cutting line SLC3 and the fourth sub-cutting line SLC4. Two first vertical structures VS1 aligned in the first direction DR1 may be disposed between the fourth sub-cutting line SLC4 and the second cutting line WLC2.

Hereinafter, a semiconductor memory device according to still other embodiments of the present disclosure will be described with reference to FIG. 10. Differences from the semiconductor memory device shown in FIGS. 2 to 7 will be mainly described.

Figure 10:
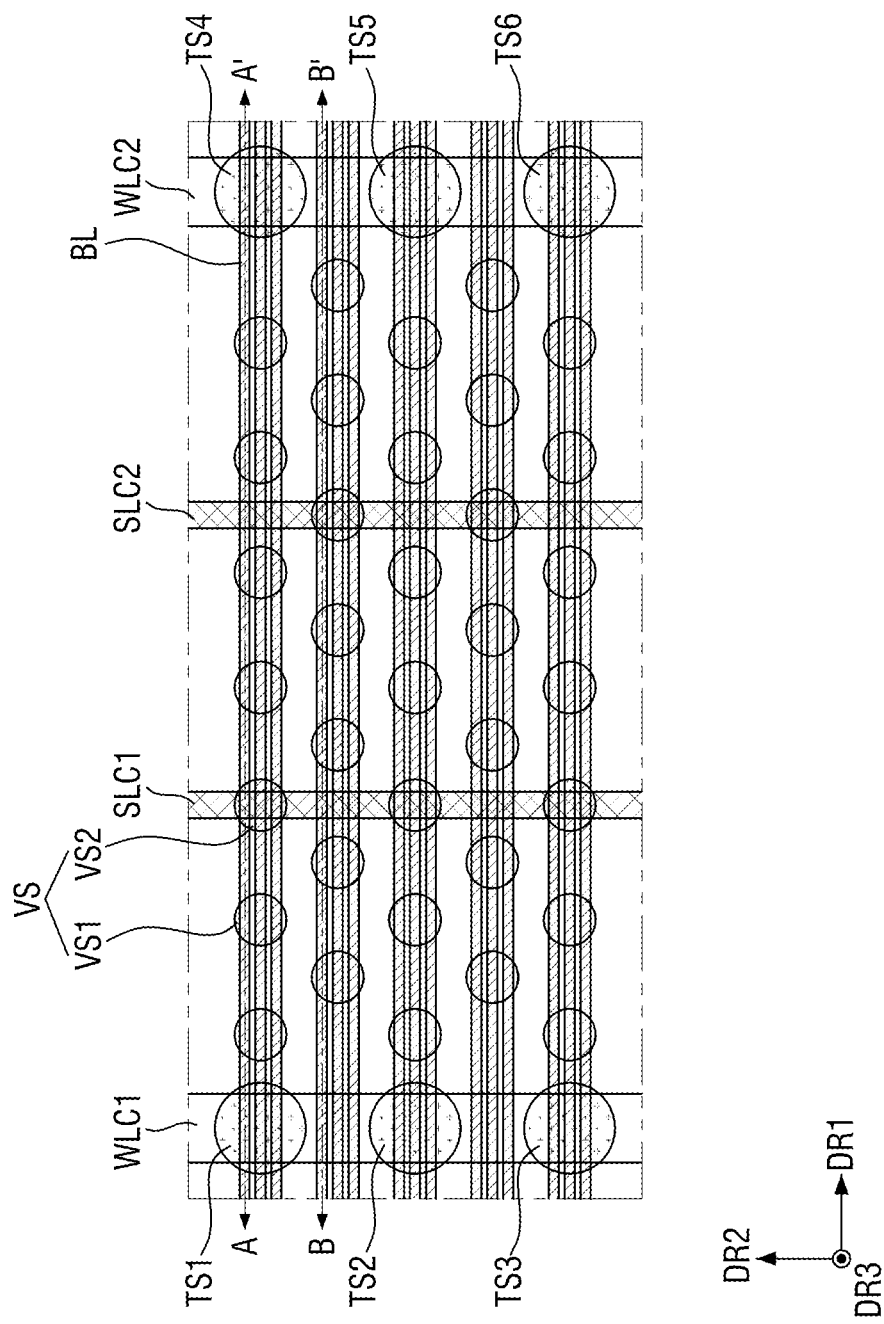
FIG. 10 is a layout view of a semiconductor memory device according to some other embodiments of the present disclosure.

FIG. 10 is a layout view of a semiconductor memory device according to some other embodiments of the present disclosure.

Referring to FIG. 10, in the semiconductor memory device according to some other embodiments of the present disclosure, three bit lines BL may overlap in the third direction DR3 each of a plurality of vertical structures VS spaced apart from each other in the first direction DR1. For example, three bit lines BL may overlap each row of a plurality of vertical structures VS spaced apart from each other in the first direction DR1.

One of the three bit lines BL disposed on the plurality of vertical structures VS spaced apart from each other in the first direction DR1 may be connected to a part of the plurality of first vertical structure VS1 through the bit line plug BLPG. Another one of the three bit lines BL disposed on the plurality of vertical structures VS spaced apart from each other in the first direction DR1 may be connected to another part of the plurality of first vertical structure VS1 through the bit line plug BLPG. The other one of the three bit lines BL disposed on the plurality of vertical structures VS spaced apart from each other in the first direction DR1 may be connected to the other part of the plurality of first vertical structure VS1 through the bit line plug BLPG.

Hereinafter, a semiconductor memory device according to still other embodiments of the present disclosure will be described with reference to FIG. 11. Differences from the semiconductor memory device shown in FIGS. 2 to 7 will be mainly described.

Figure 11:
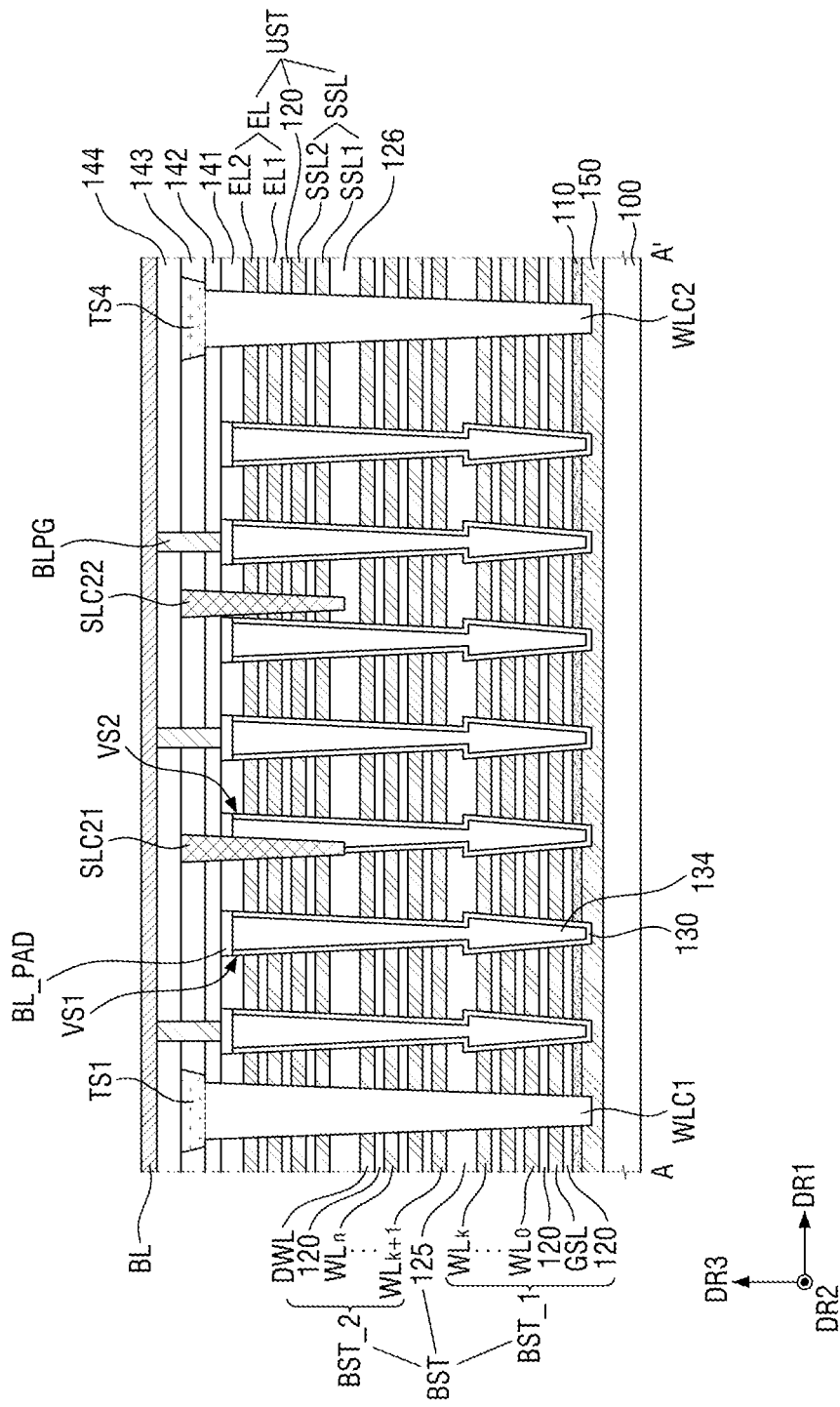
FIG. 11 is a cross-sectional view of a semiconductor memory device along line A-A' of FIG. 10 according to still other embodiments of the present disclosure.

FIG. 11 is a cross-sectional view illustrating a semiconductor memory device according to still other embodiments of the present disclosure.

Referring to FIG. 11, in the semiconductor memory device according to some other embodiments of the present disclosure, the sub-cutting lines SLC21 and SLC22 may be misaligned with the second vertical structure VS2.

For example, the center of the first sub-cutting line SLC21 may not coincide with the center of the second vertical structure VS2. The first sub-cutting line SLC21 may overlap the channel layer 130 of the second vertical structure VS2 in the vertical direction DR3. For example, at least a part of the bottom surface of the first sub-cutting line SLC21 in contact with the second vertical structure VS2 in the first direction DR1 may be in contact with the inter-structure insulating layer 126. However, the present disclosure is not limited thereto.

Hereinafter, a semiconductor memory device according to still other embodiments of the present disclosure will be described with reference to FIG. 12. Differences from the semiconductor memory device shown in FIGS. 2 to 7 will be mainly described.

Figure 12:
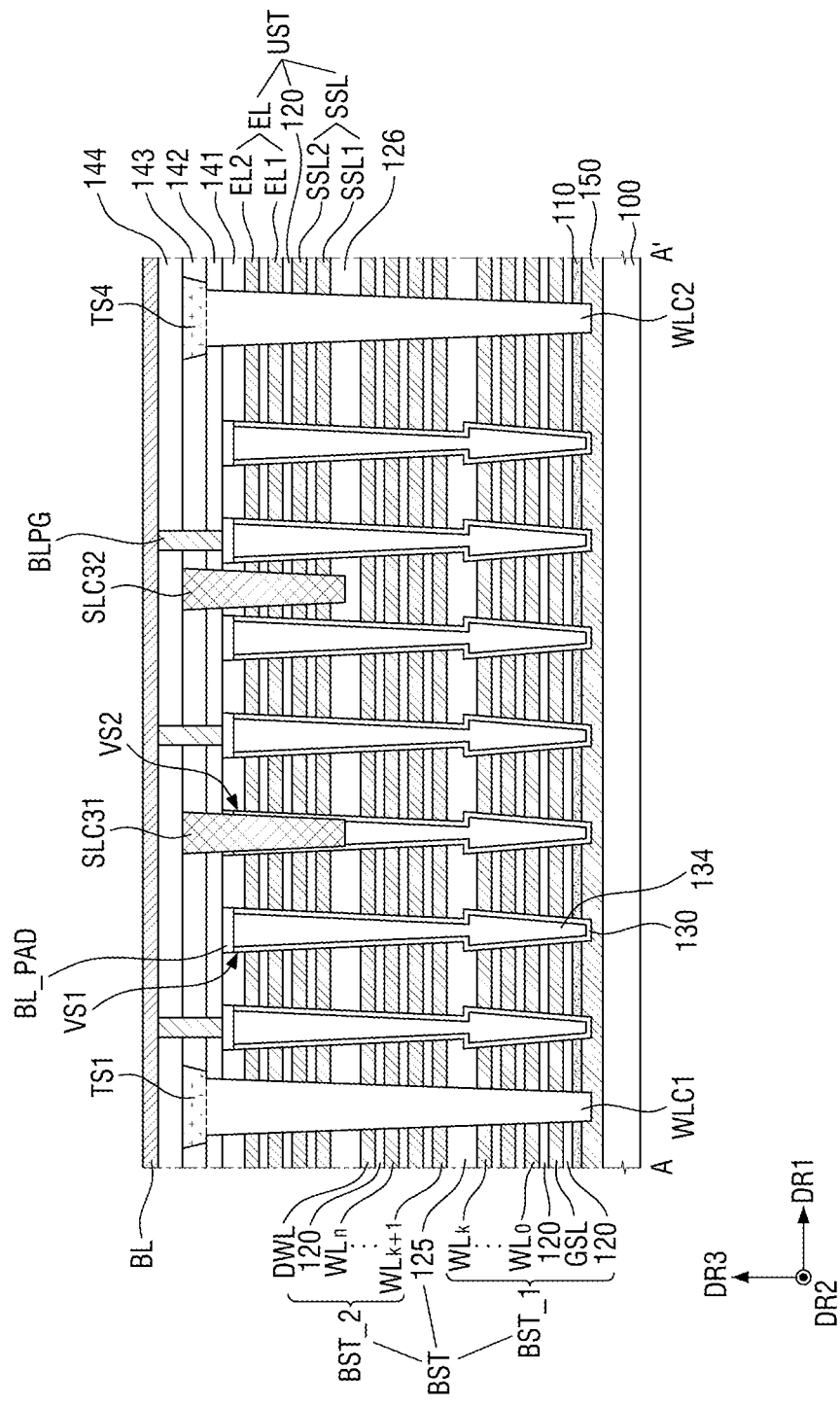
FIG. 12 is a cross-sectional view of a semiconductor memory device along line A-A' of FIG. 10 according to still other embodiments of the present disclosure.

FIG. 12 is a cross-sectional view illustrating a semiconductor memory device according to still other embodiments of the present disclosure.

Referring to FIG. 12, in the semiconductor memory device according to some other embodiments of the present disclosure, the sub-cutting lines SLC31 and SLC32 may be in contact with the channel layers 130 formed on both sidewalls of the second vertical structure VS2. The first sub-cutting line SLC31 may overlap the channel layers 130 formed on both sidewalls of the second vertical structure VS2 in the vertical direction DR3.

For example, the width of the top surface of the first sub-cutting line SLC31 in the first direction DR1 may be substantially the same as the width W4 (see FIG. 3) of the uppermost surface of the second vertical structure VS2. However, the present disclosure is not limited thereto.

Hereinafter, a semiconductor memory device according to still other embodiments of the present disclosure will be described with reference to FIG. 13. Differences from the semiconductor memory device shown in FIGS. 2 to 7 will be mainly described.

Figure 13:
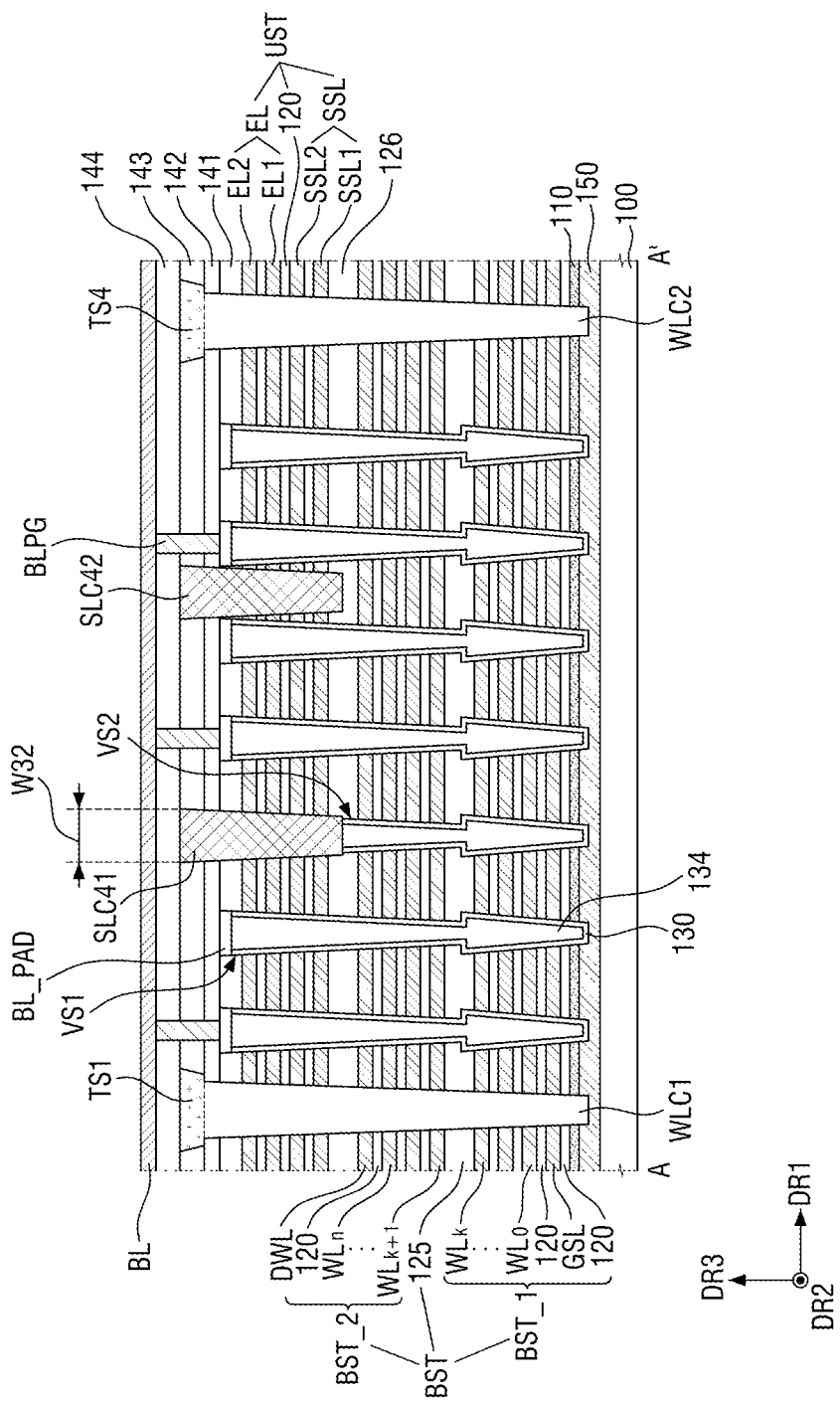
FIG. 13 is a cross-sectional view of a semiconductor memory device along line A-A' of FIG. 10 according to still other embodiments of the present disclosure.

FIG. 13 is a cross-sectional view illustrating a semiconductor memory device according to still other embodiments of the present disclosure.

Referring to FIG. 13, in the semiconductor memory device according to some other embodiments of the present disclosure, the widths of the sub-cutting lines SLC41 and SLC42 in the first direction DR1 may be greater than the width of the second vertical structure VS2.

For example, a width W32 of the top surface of the first sub-cutting line SLC41 in the first direction DR1 may be greater than the width W4 (see FIG. 3) of the uppermost surface of the second vertical structure VS2. The first sub-cutting line SLC41 may overlap the channel layers 130 formed on both sidewalls of the second vertical structure VS2 in the vertical direction DR3. At least a part of the bottom surface of the first sub-cutting line SLC41 in contact with the second vertical structure VS2 in the first direction DR1 may be in contact with the inter-structure insulating layer 126.

Hereinafter, a semiconductor memory device according to still other embodiments of the present disclosure will be described with reference to FIG. 14. Differences from the semiconductor memory device shown in FIGS. 2 to 7 will be mainly described.

Figure 14:
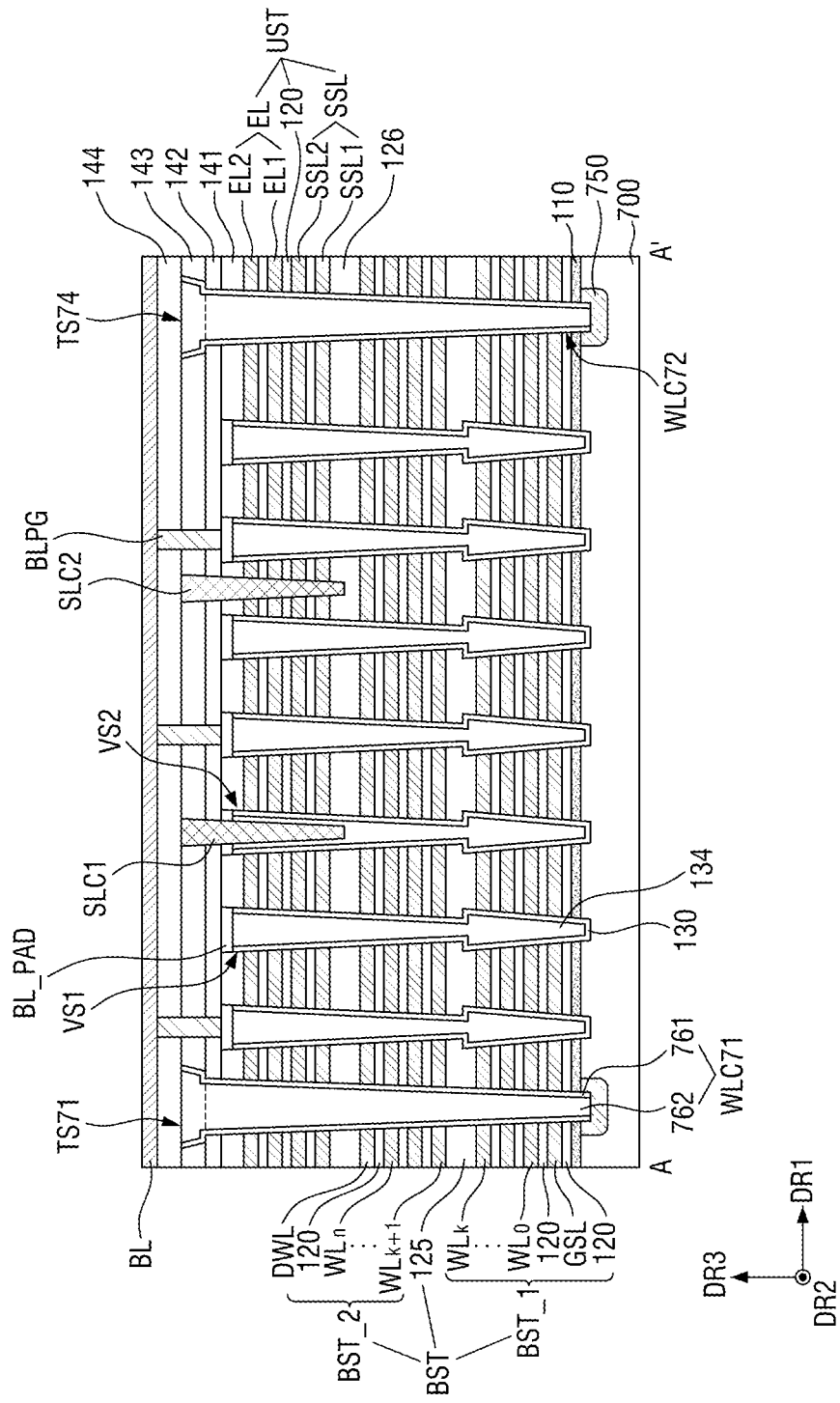
FIG. 14 is a cross-sectional view of a semiconductor memory device along line A-A' of FIG. 10 according to still other embodiments of the present disclosure.

FIG. 14 is a cross-sectional view illustrating a semiconductor memory device according to still other embodiments of the present disclosure.

Referring to FIG. 14, in the semiconductor memory device according to some other embodiments of the present disclosure, each of a first cutting line WLC71, a second cutting line WLC72, and upper supporters TS71 and TS74 may be formed of a double layer.

For example, each of the first cutting line WLC71, the second cutting line WLC72, the first upper supporter TS71, and the fourth upper supporter TS74 may include a spacer 761 and a plug pattern 762. The plug pattern 762 may be connected to an impurity region 750 disposed in a substrate 700 while penetrating the upper stacked structure UST and the lower stacked structure BST. The plug pattern 762 may include, e.g., a conductive material. The impurity region 750 may extend in, e.g., the second direction DR2.

The spacer 761 may extend along the sidewall of the plug pattern 762. The spacer 761 may include an insulating material. Accordingly, the plug pattern 762 may be electrically insulated from the upper stacked structure UST, the lower metal lines GSL, $WL_0$ to $WL_n$, and DWL of the lower stacked structure BST, the first upper metal line SSL, and the second upper metal line EL.

For example, the spacers 761 disposed at the first cutting line WLC71 and the first upper supporter TS71 may be integrally formed. Further, the plug patterns 762 disposed at the first cutting line WLC71 and the first upper supporter TS71 may be integrally formed.

Hereinafter, a semiconductor memory device according to still other embodiments of the present disclosure will be described with reference to FIG. 15. Differences from the semiconductor memory device shown in FIGS. 2 to 7 will be mainly described.

Figure 15:
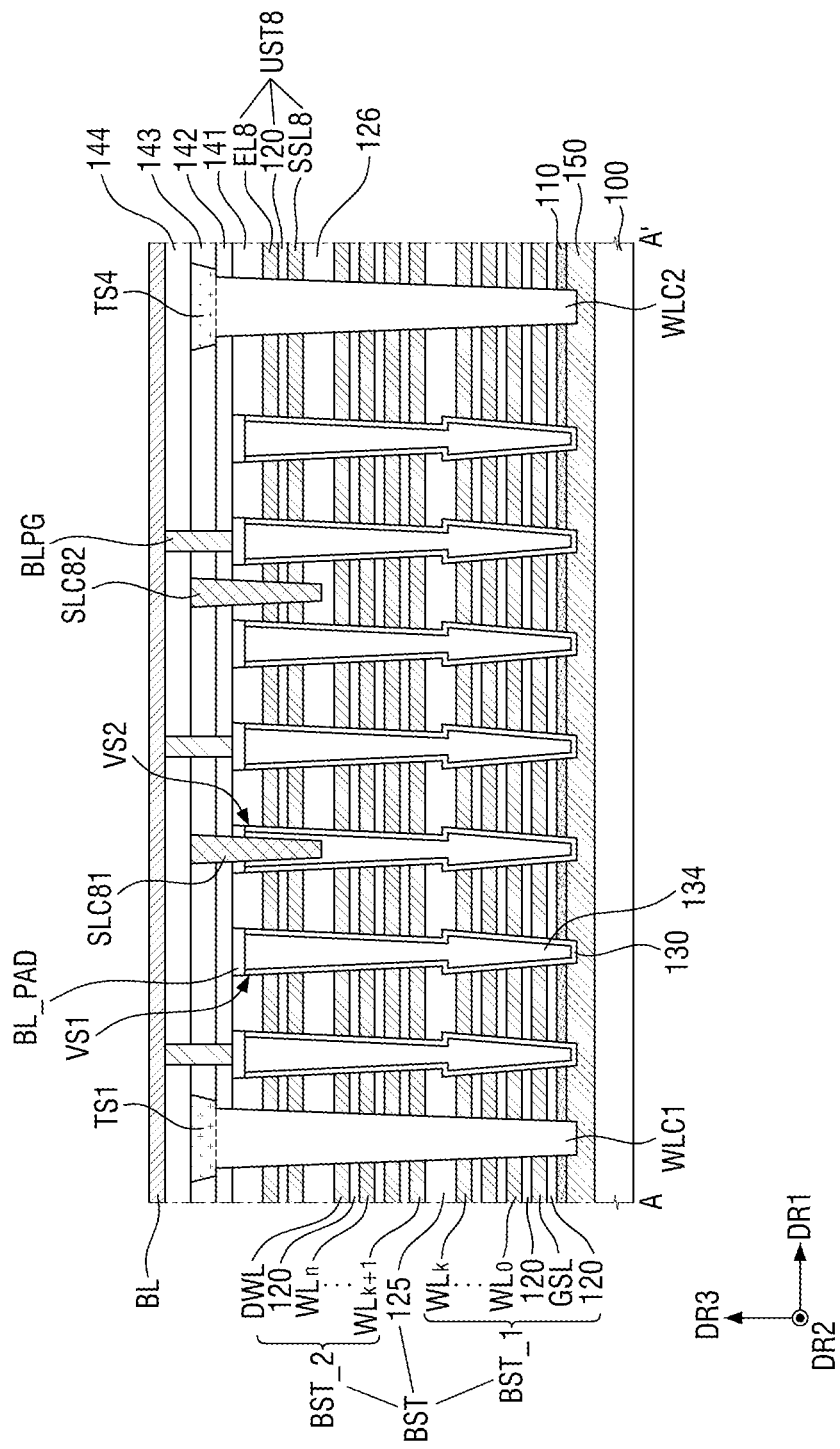
FIG. 15 is a cross-sectional view of a semiconductor memory device along line A-A' of FIG. 10 according to still other embodiments of the present disclosure.

FIG. 15 is a cross-sectional view illustrating a semiconductor memory device according to still other embodiments of the present disclosure.

Referring to FIG. 15, in the semiconductor memory device according to some other embodiments of the present disclosure, an upper stacked structure UST8 may include one first upper metal line SSL8 and one second upper metal EL8.

The first upper metal line SSL8 may be disposed on the inter-structure insulating layer 126. The second upper metal line EL8 may be disposed on the first upper metal line SSL8. The first inter-electrode insulating layer 120 may be disposed between the first upper metal line SSL8 and the second upper metal line EL8.

Each of a first sub-cutting line SLC81 and a second sub-cutting line SLC82 may cut the upper stacked structure UST8. The bottom surfaces of the first sub-cutting line SLC81 and the second sub-cutting line SLC82 may be formed in the inter-structure insulating layer 126.

Hereinafter, a semiconductor memory device according to still other embodiments of the present disclosure will be described with reference to FIG. 16. Differences from the semiconductor memory device shown in FIGS. 2 to 7 will be mainly described.

Figure 16:
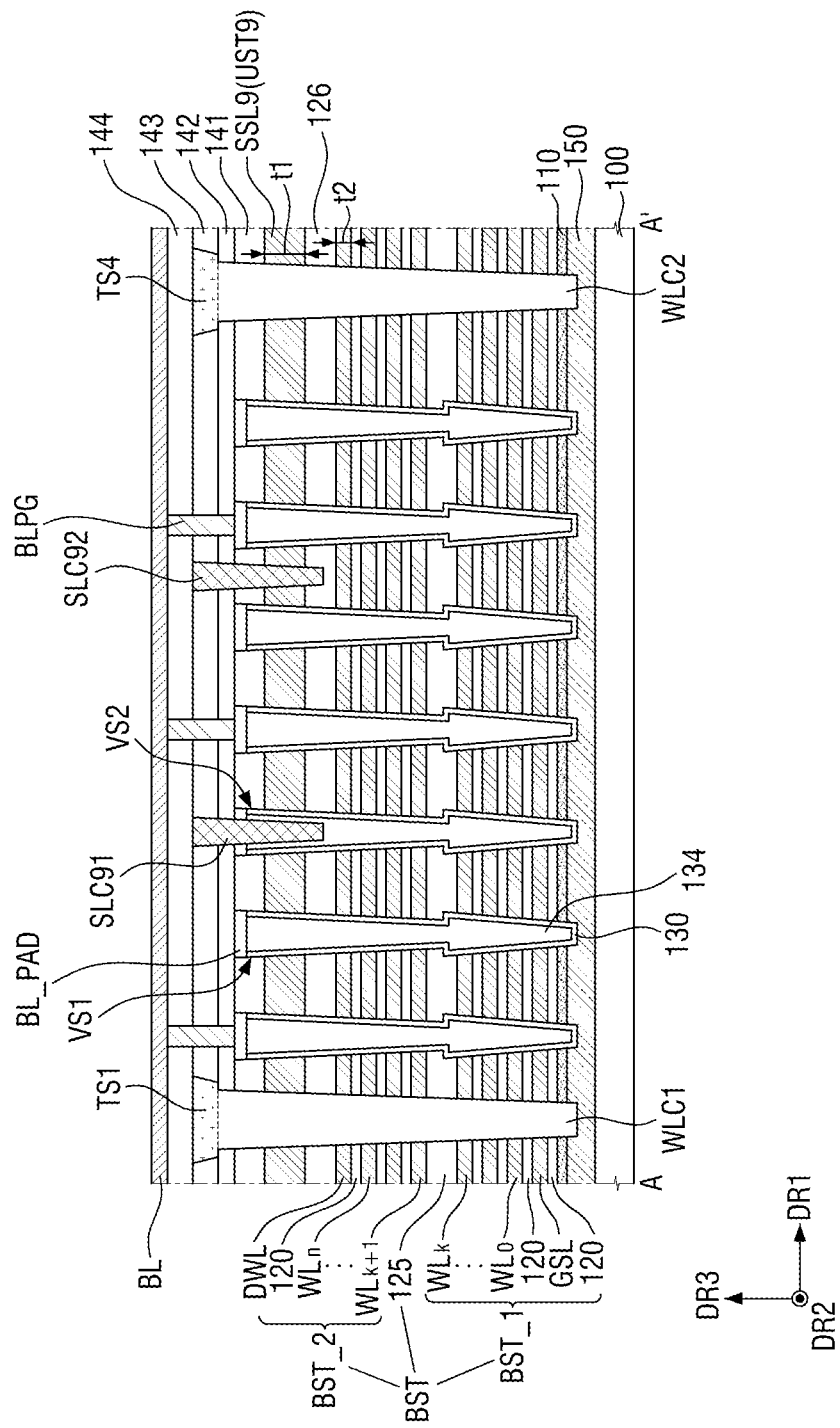
FIG. 16 is a cross-sectional view of a semiconductor memory device along line A-A' of FIG. 10 according to still other embodiments of the present disclosure.

FIG. 16 is a cross-sectional view illustrating a semiconductor memory device according to still other embodiments of the present disclosure.

Referring to FIG. 16, in the semiconductor memory device according to some other embodiments of the present disclosure, an upper stacked structure UST9 may include one first upper metal line SSL9. The first upper metal line SSL9 may be disposed on the inter-structure insulating layer 126. For example, a first thickness t1 of the first upper metal line SSL9 in the vertical direction DR3 may be greater than a second thickness t2 of the lower metal line in the vertical direction DR3.

Each of a first sub-cutting line SLC91 and a second sub-cutting line SLC92 may cut the upper stacked structure UST9. The bottom surfaces of the first sub-cutting line SLC91 and the second sub-cutting line SLC92 may be formed in the inter-structure insulating layer 126.

Hereinafter, a semiconductor memory device according to still other embodiments of the present disclosure will be described with reference to FIG. 17. Differences from the semiconductor memory device shown in FIGS. 2 to 7 will be mainly described.

Figure 17:
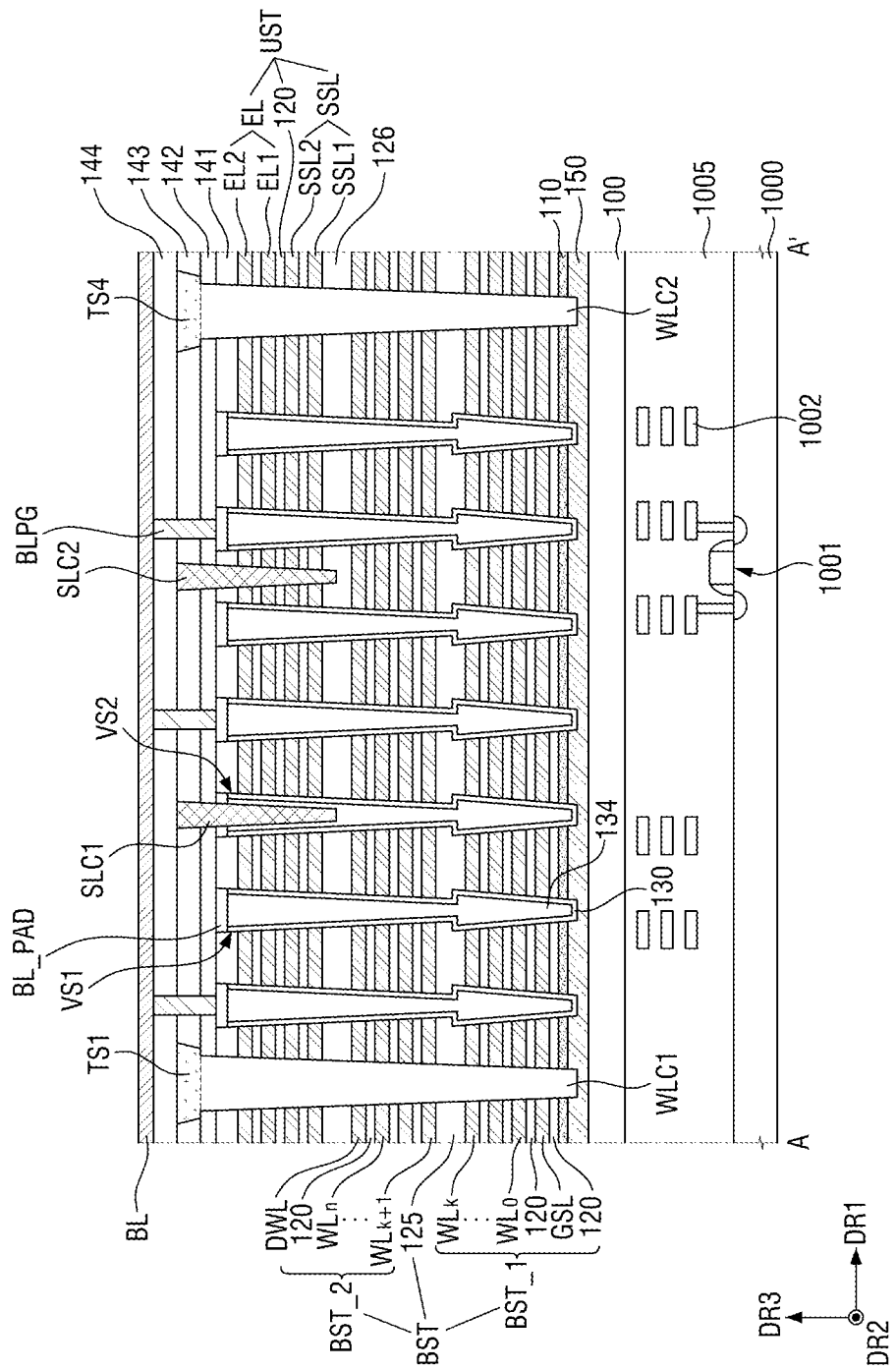
FIG. 17 is a cross-sectional view of a semiconductor memory device along line A-A' of FIG. 10 according to still other embodiments of the present disclosure.

FIG. 17 is a cross-sectional view illustrating a semiconductor memory device according to still other embodiments of the present disclosure.

Referring to FIG. 17, in the semiconductor memory device according to some other embodiments of the present disclosure, a peripheral circuit region may be disposed below the substrate 100. Specifically, the semiconductor device according to some other embodiments of the present disclosure may include a peripheral circuit board 1000, a transistor 1001, a plurality of wirings 1002, and a fifth interlayer insulating layer 1005.

The peripheral circuit board 1000 may be disposed under the substrate 100. The transistor 1001 may be disposed on the peripheral circuit board 1000. The fifth interlayer insulating layer 1005 may be disposed between the peripheral circuit board 1000 and the substrate 100. The plurality of wirings 1002 may be disposed in the fifth interlayer insulating layer 1005 and may be electrically connected to the transistor 1001.

Hereinafter, a semiconductor memory device according to still other embodiments of the present disclosure will be described with reference to FIG. 18. Differences from the semiconductor memory device shown in FIGS. 2 to 7 will be mainly described.

Figure 18:
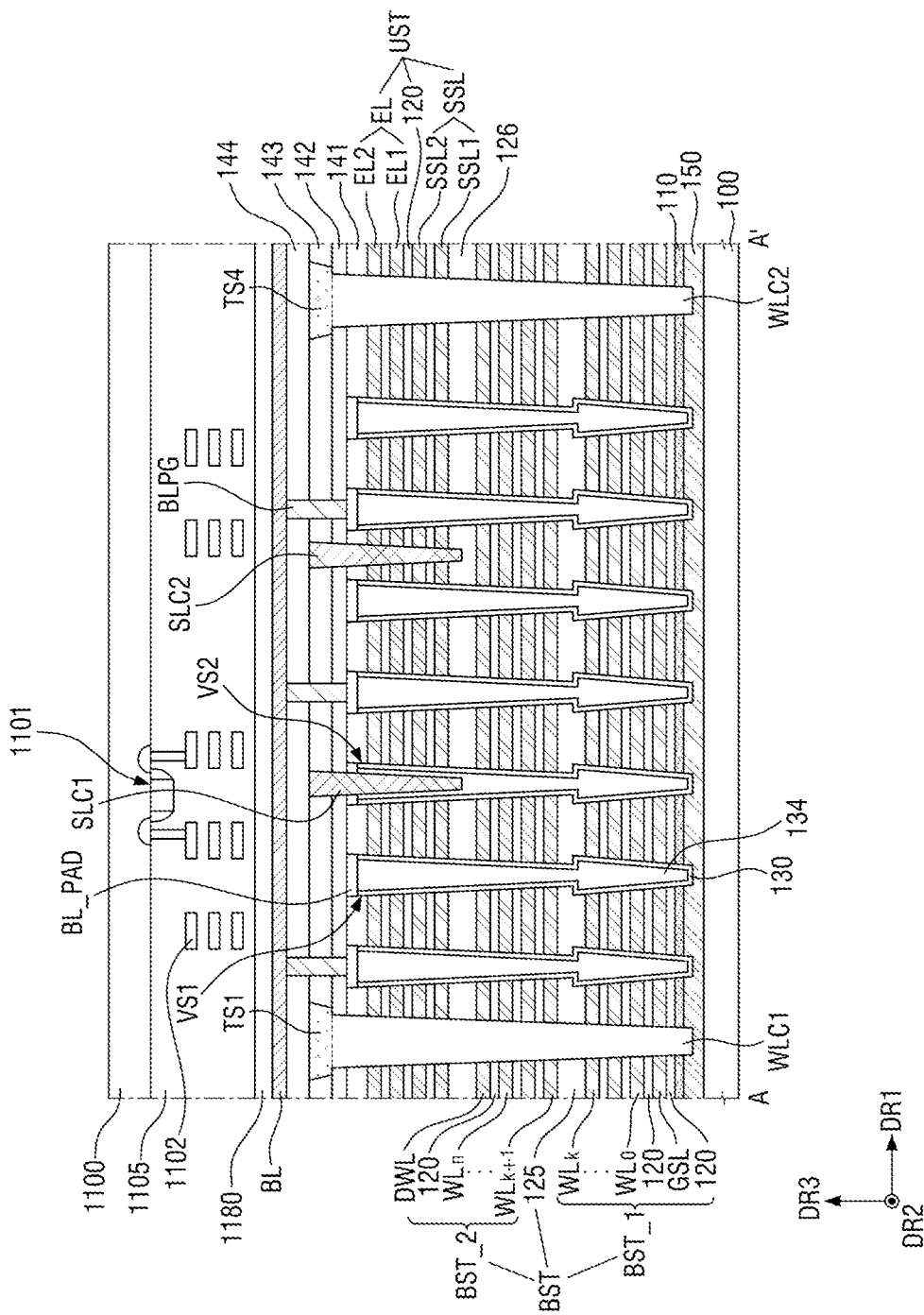
FIG. 18 is a cross-sectional view of a semiconductor memory device along line A-A' of FIG. 10 according to still other embodiments of the present disclosure.

FIG. 18 is a cross-sectional view illustrating a semiconductor memory device according to still other embodiments of the present disclosure.

Referring to FIG. 18, in the semiconductor memory device according to some other embodiments of the present disclosure, a peripheral circuit region may be disposed on the bit line BL. The peripheral circuit region shown in FIG. 18 may have a structure in which the peripheral circuit region shown in FIG. 17 is upside down.

Specifically, the semiconductor device according to some other embodiments of the present disclosure may include a peripheral circuit board 1100, a transistor 1101, a plurality of wirings 1102, a fifth interlayer insulating layer 1105, and a connecting line 1180. The peripheral circuit board 1100 may be disposed above the bit line BL. The transistor 1101 may be disposed on the peripheral circuit board 1100. The fifth interlayer insulating layer 1105 may be disposed between the peripheral circuit board 1100 and the bit line BL. The plurality of wiring 1102 may be disposed in the fifth interlayer insulating layer 1105 and may be electrically connected to the transistor 1101.

The connecting line 1180 may be disposed between the bit line BL and the fifth interlayer insulating layer 1105. The connecting line 1180 may electrically connect the bit line BL and the plurality of wirings 1102.

Hereinafter, a semiconductor memory device according to still other embodiments of the present disclosure will be described with reference to FIG. 19. Differences from the semiconductor memory device shown in FIGS. 2 to 7 will be mainly described.

Figure 19:
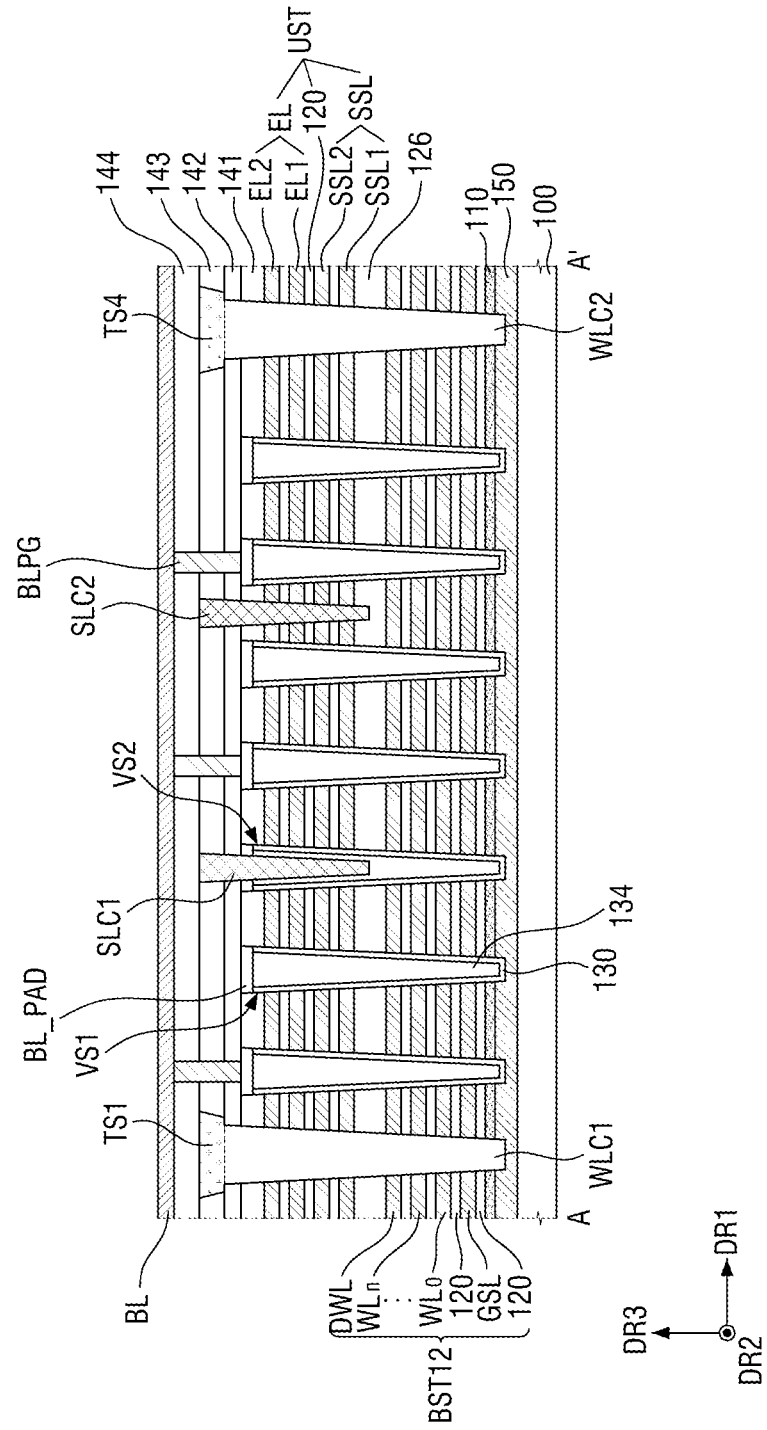
FIG. 19 is a cross-sectional view of a semiconductor memory device along line A-A' of FIG. 10 according to still other embodiments of the present disclosure.

FIG. 19 is a cross-sectional view illustrating a semiconductor memory device according to still other embodiments of the present disclosure.

Referring to FIG. 19, in the semiconductor memory device according to some other embodiments of the present disclosure, a lower stacked structure BST12 may include a plurality of lower metal lines GSL, $WL_0$ to $WL_n$, and DWL and a plurality of first inter-electrode insulating layers 120 that are stacked in the vertical direction DR3. The first inter-electrode insulating layers 120 may be disposed between the lower metal lines GSL, $WL_0$ to $WL_n$, and DWL spaced apart from each other in the vertical direction DR3.

For example, the sidewall of the first vertical structure VS1 may have a constant tilt profile. In other words, the width of the first vertical structure VS1 in the first direction DR1 may be gradually reduced as a distance from a bit line pad BL_PAD increases. The sidewall of the second vertical structure VS2 may have a structure similar to that of the sidewall of the first vertical structure VS1.

Hereinafter, a method of manufacturing a semiconductor memory device according to some embodiments of the present disclosure will be described with reference to FIGS. 3 and 20 to 29.

FIGS. 20 to 29 are diagrams illustrating stages in a method of manufacturing a semiconductor memory device according to some embodiments of the present disclosure. FIGS. 20, 23, 26, and 28 are plan views, and FIGS. 21, 22, 24, 25, 27, and 29 are cross-sectional views along line A-A' in corresponding plan views.

Figure 20:
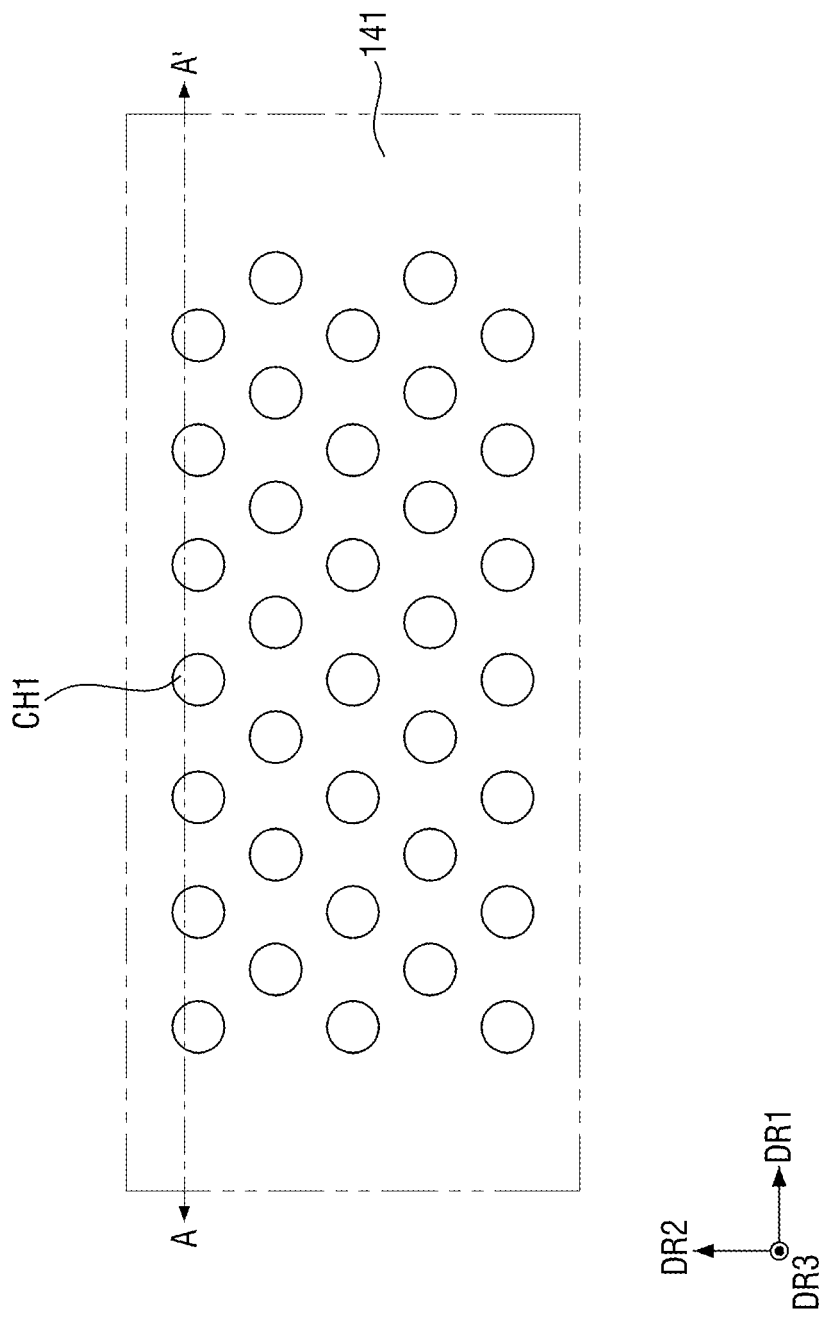
FIGS. 20 to 29 are diagrams of stages in a method of manufacturing a semiconductor memory device according to some embodiments of the present disclosure.
Figure 21:
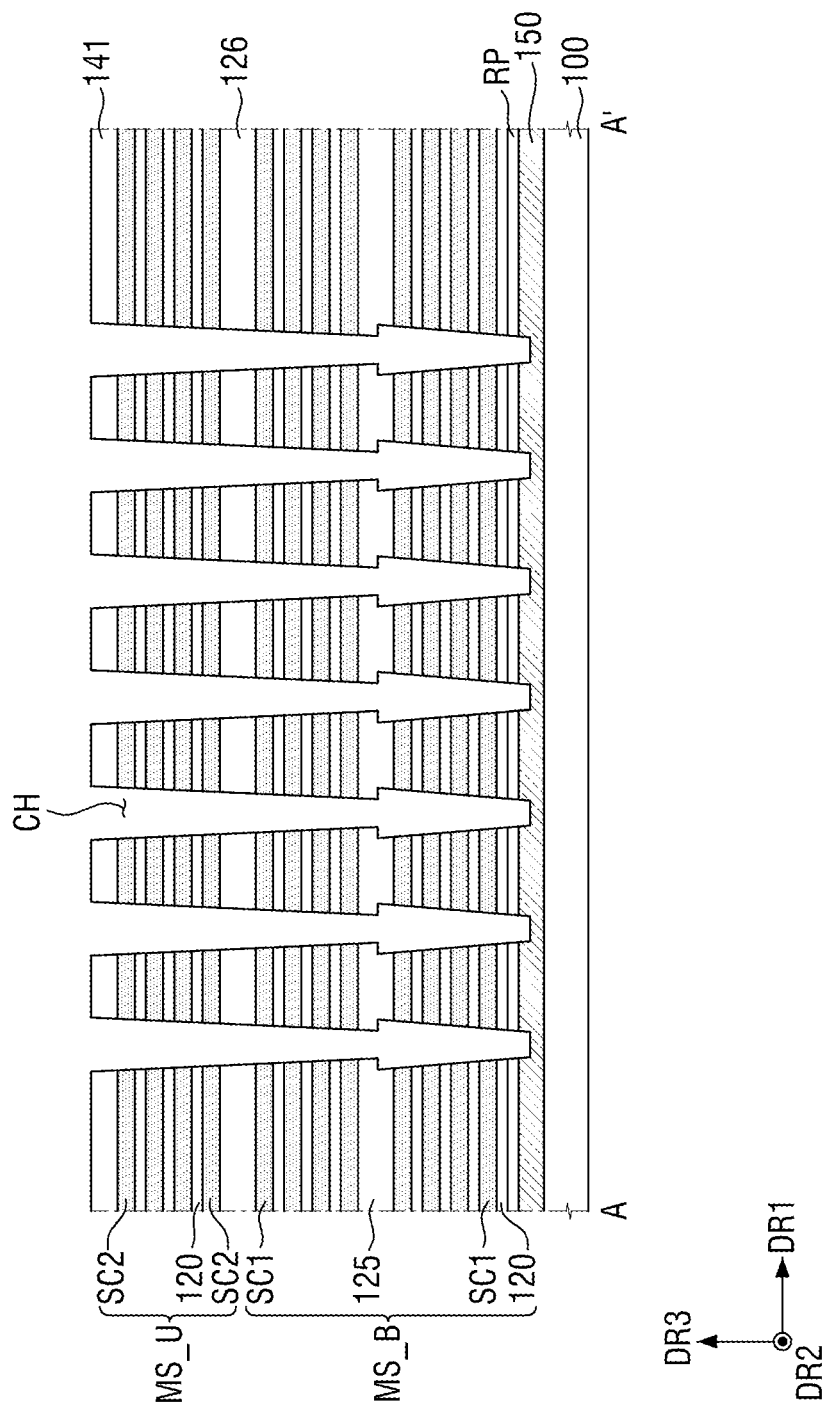

Referring to FIGS. 20 and 21, the horizontal conductive substrate 150 and an alternative insulating layer RP may be sequentially formed on the substrate 100.

Then, a part of a lower mold film MS_B including the first inter-electrode insulating layers 120, the second inter-electrode insulating layer 125, and lower sacrificial layers SC1 may be formed on the alternative insulating layer RP. Specifically, the first inter-electrode insulating layers 120 and the lower sacrificial layers SC1 may be alternately stacked on the alternative insulating layer RP. A part of the second inter-electrode insulating layer 125 may be formed on one of the lower sacrificial layers SC1.

Then, a part of a channel hole CH penetrating a part of the lower mold film MS_B in the vertical direction DR3 may be formed. A sacrificial pattern may fill a part of the channel hole CH.

Then, the other part of the second inter-electrode insulating layer 125 may be formed on a part of the lower mold film MS_B. The other part of the lower mold film MS_B may be formed on the second inter-electrode insulating layer 125. The other part of the lower mold film MS_B may include the lower sacrificial layer SC1 and the first inter-electrode insulating layer 120 that are alternately stacked.

Then, the inter-structure insulating layer 126, an upper mold film MS_U, and the first interlayer insulating layer 141 may be sequentially formed on the lower mold film MS_B. The upper mold film MS_U may include an upper sacrificial layer SC2 and the first inter-electrode insulating layer 120 that are alternately stacked.

Then, the other part of the channel hole CH penetrating the first interlayer insulating layer 141, the upper molded film MS_U, the inter-structure insulating layer 126, and the other part of the lower molded film MS_B in the vertical direction DR3 may be formed. The other part of the channel hole CH may overlap a part of the channel hole CH formed in the lower mold film MS_B in the vertical direction DR3. Then, the sacrificial pattern formed in a part of the channel hole CH may be removed to form the channel hole CH.

Figure 22:
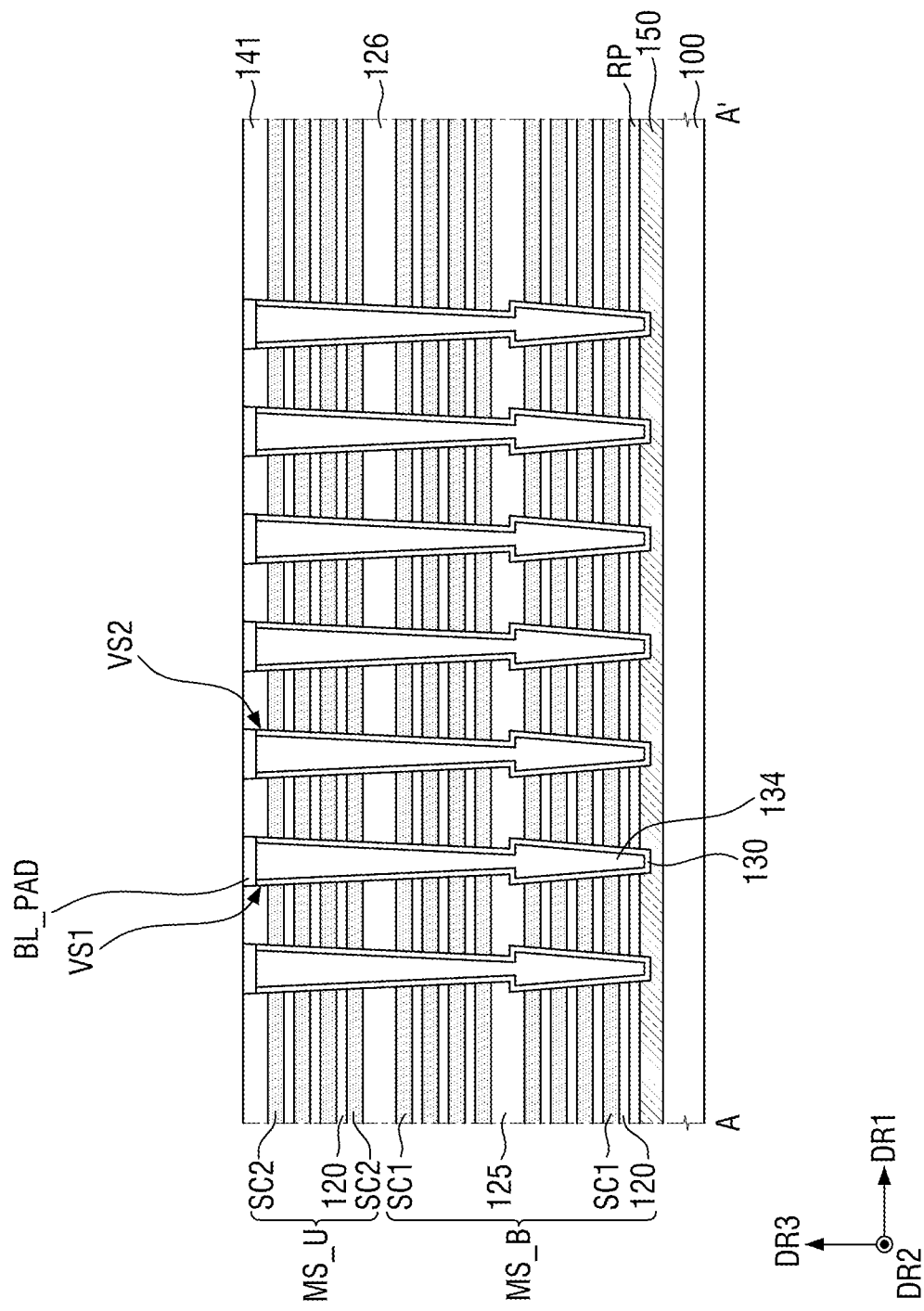

Referring to FIG. 22, the first vertical structure VS1, the second vertical structure VS2, and the bit line pad BL_PAD may be formed in the channel hole CH. Specifically, the channel insulating layer 132 (see FIG. 5), the channel layer 130, and the insulating pattern 134 may be formed in the channel hole CH. Then, inside the channel hole CH, the bit line pad BL_PAD may be formed on the channel insulating layer 132 (see FIG. 5), the channel layer 130, and the insulating pattern 134.

Figure 23:
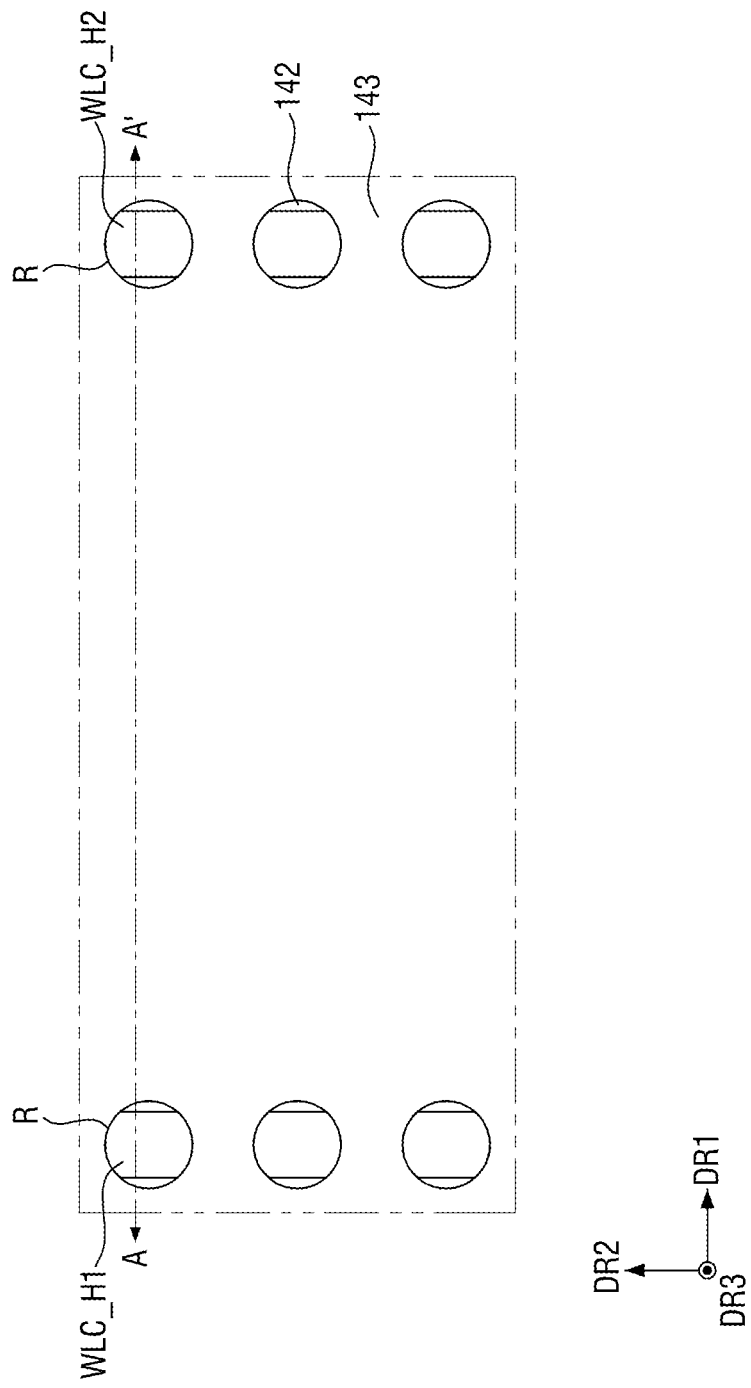
Figure 24:
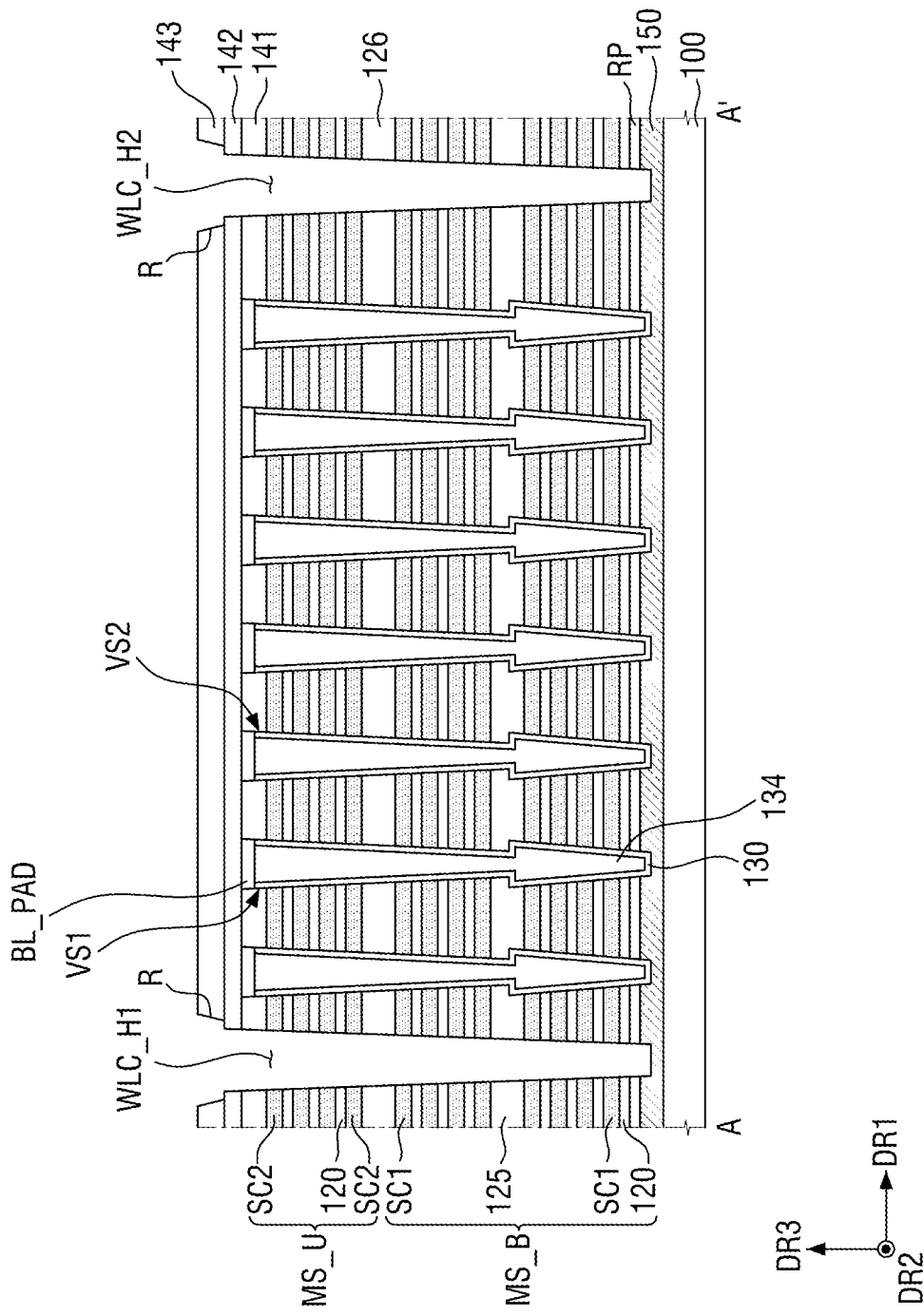

Referring to FIGS. 23 and 24, the second interlayer insulating layer 142 may be formed on the first interlayer insulating layer 141. Then, a first cutting line trench WLC_H1 and a second cutting line trench WLC_H2 may be formed, e.g., via etching. The second cutting line trench WLC_H2 may be spaced apart from the first cutting line trench WLC_H1 in the first direction DR1. Each of the first cutting line trench WLC_H1 and the second cutting line trench WLC_H2 may extend in the second direction DR2.

Then, the third interlayer insulating layer 143 may be formed on the second interlayer insulating layer 142. In some other embodiments, the first cutting line trench WLC_H1 and the second cutting line trench WLC_H2 may be formed after the second interlayer insulating layer 142 and the third interlayer insulating layer 143 are formed.

Then, a plurality of recesses R may be formed in the third interlayer insulating layer 143. The plurality of recesses R may overlap the first cutting line trench WLC_H1 and the second cutting line trench WLC_H2 in the vertical direction DR3. For example, the width of the recess R in the first direction DR1 may be greater than the width of the first cutting line trench WLC_H1 in the first direction DR1.

Figure 25:
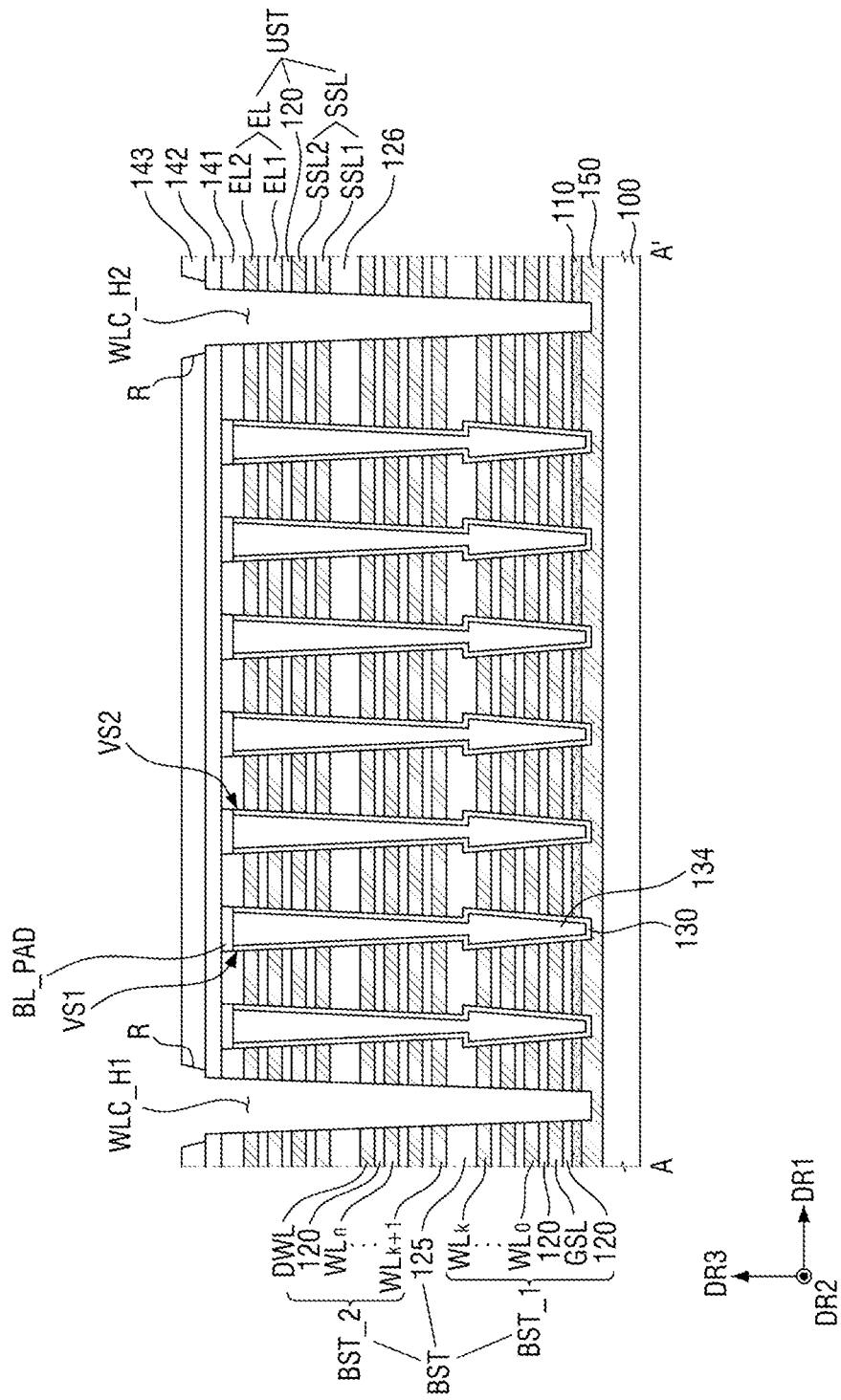

Referring to FIG. 25, the lower sacrificial layer SC1 and the upper sacrificial layer SC2 may be removed. The lower metal lines GSL, $WL_0$ to $WL_n$, and DWL may be formed in the space from which the lower sacrificial layer SC1 has been removed. Further, the first upper metal line SSL and the second upper metal line EL may be formed in the space from which the upper sacrificial layer SC2 has been removed. In other words, the lower sacrificial layer SC1 and the upper sacrificial layer SC2 may be replaced with the lower metal lines GSL, $WL_0$ to $WL_n$, and DWL, the first upper metal line SSL, and the second upper metal line EL through a replacement metal gate process.

The alternative insulating layer RP may be removed. The vertical structure support layer 110 may be formed in the space from which the alternative insulating layer RP has been removed.

Figure 26:
Figure 27:
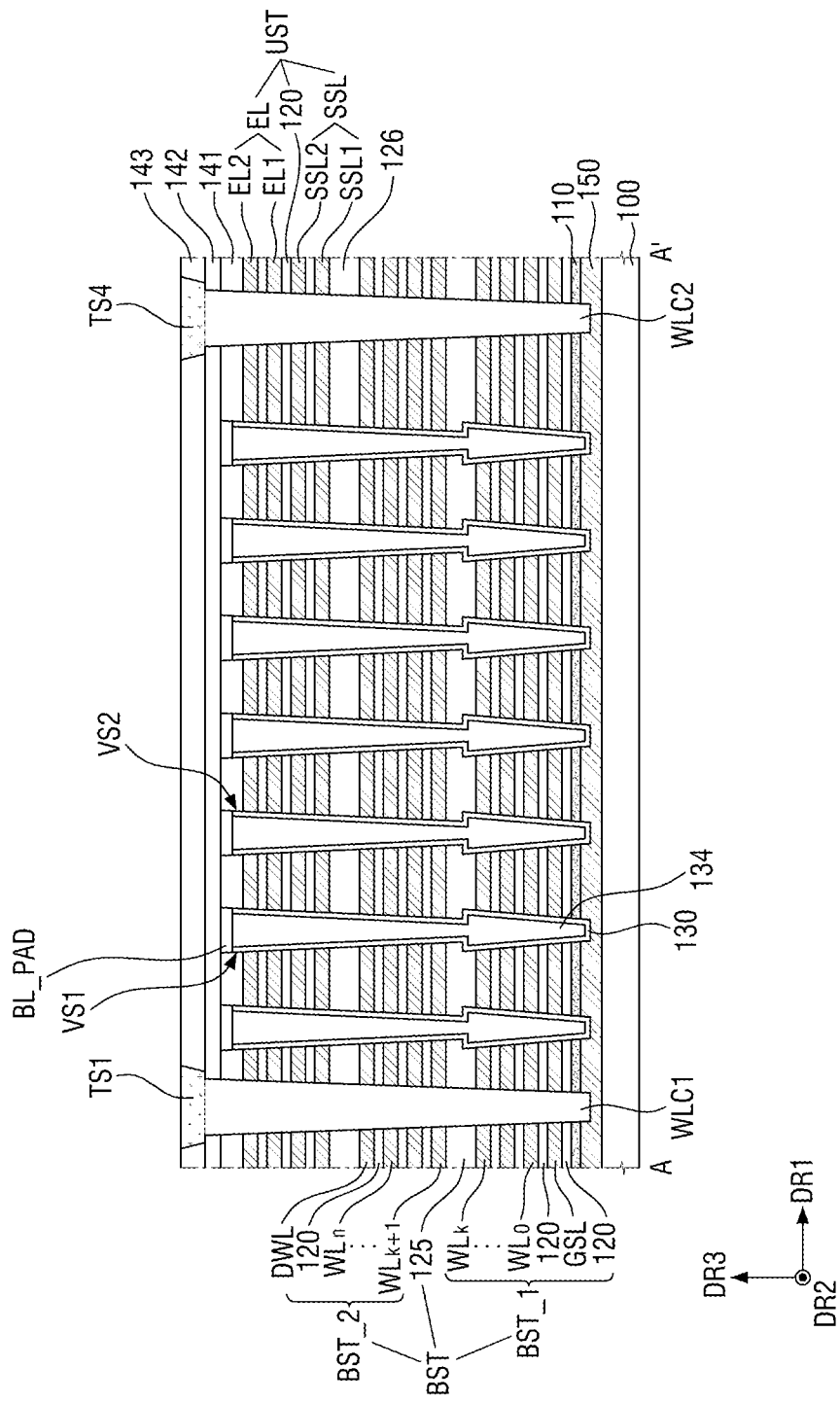

Referring to FIGS. 26 and 27, the first cutting line WLC1 may be formed in the first cutting line trench WLC_H1. Further, the second cutting line WLC2 may be formed in the second cutting line trench WLC_H2.

For example, the first upper supporter TS1 may be formed in the recess R formed on the first cutting line trench WLC_H1. Further, the fourth upper supporter TS4 may be formed in the recess R formed on the second cutting line trench WLC_H2. For example, the first cutting line WLC1, the second cutting line WLC2, and the upper supporters TS1 and TS4 may be formed by the same process, e.g., simultaneously. For example, the first cutting line WLC1, the second cutting line WLC2, and the upper supporters TS1 and TS4 may be formed by, e.g., continuously, filling the first cutting line trench WLC_H1, the second cutting line WLC2, and the recesses R with an insulating material, e.g., as described above, until the recesses R are completely filled. However, the present disclosure is not limited thereto.

Figure 28:
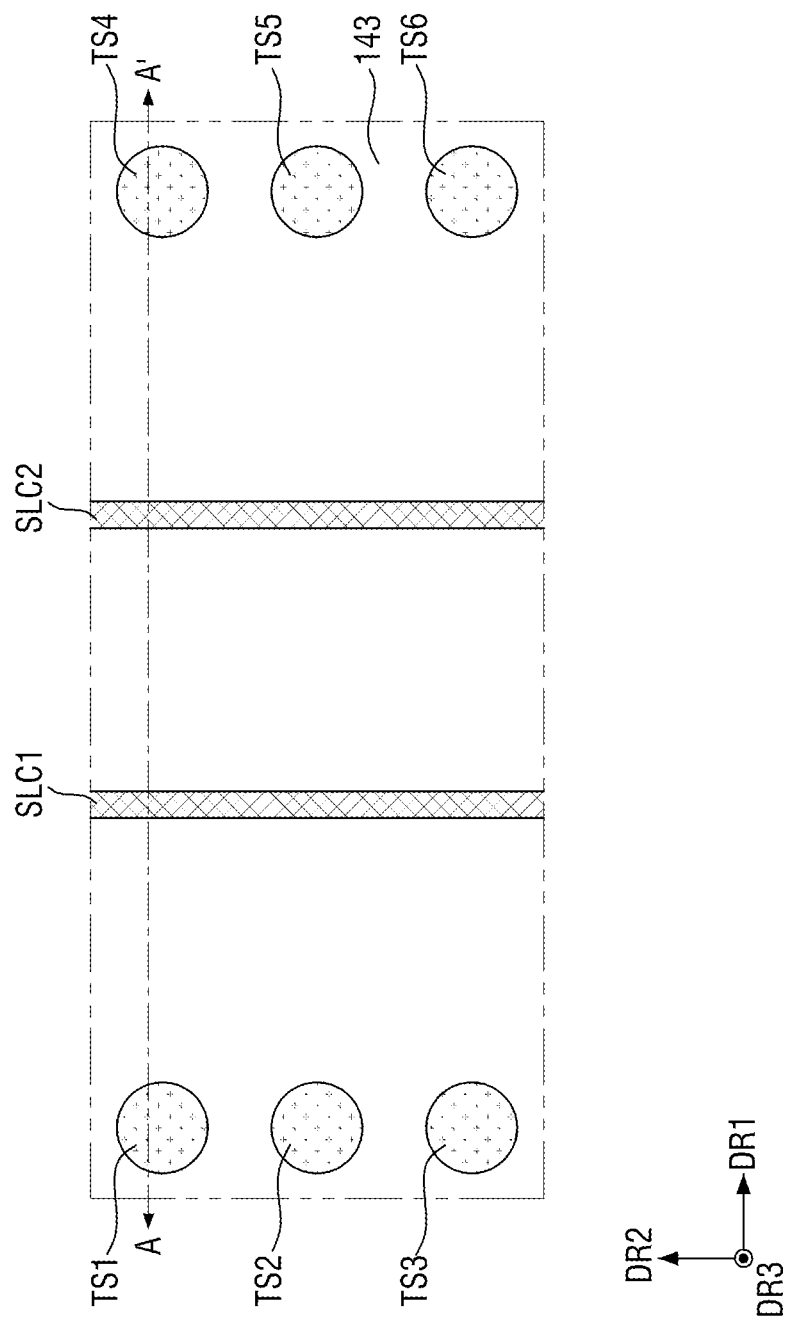
Figure 29:
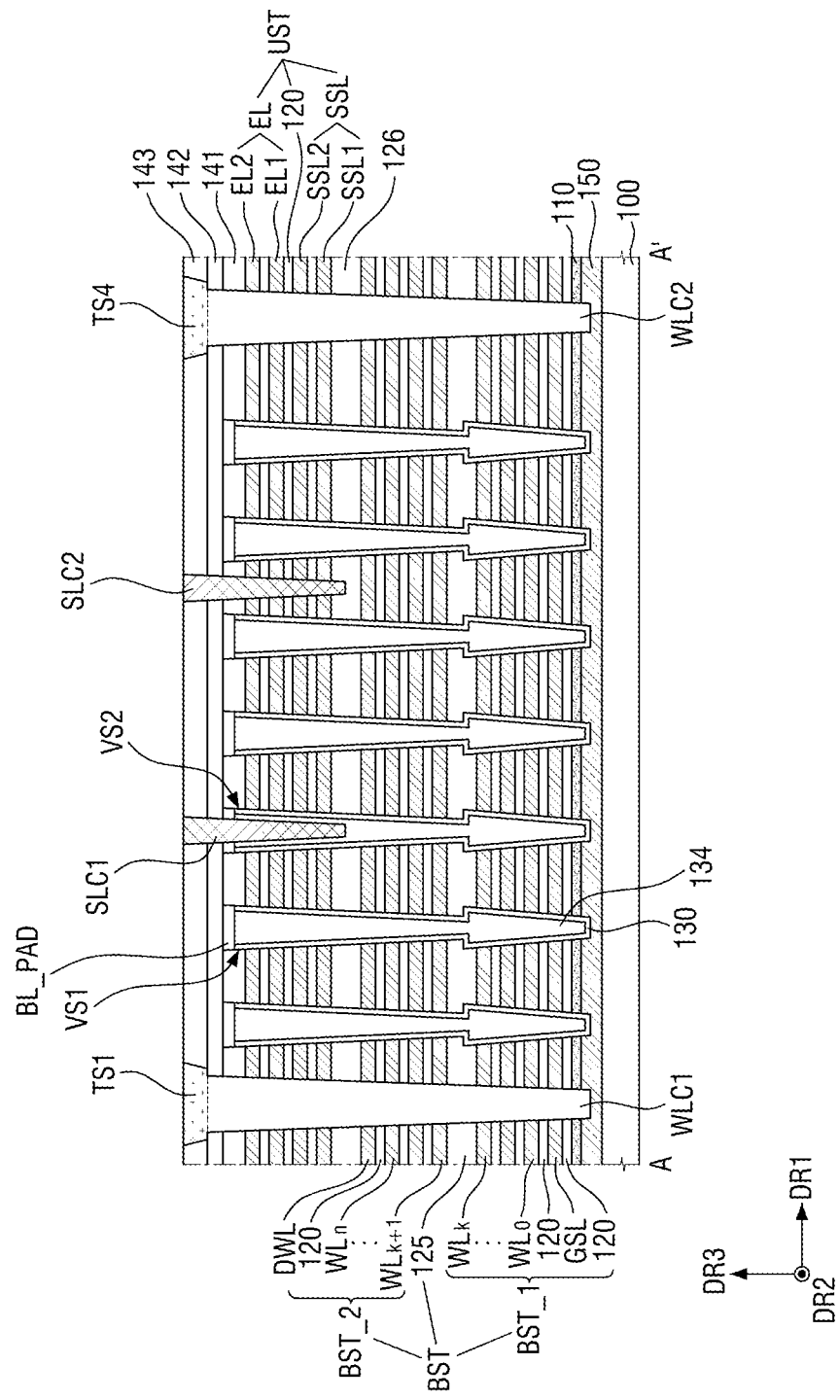

Referring to FIGS. 28 and 29, the first sub-cutting line SLC1 and the second sub-cutting line SLC2 penetrating the third interlayer insulating layer 143, the second interlayer insulating layer 142, the first interlayer insulating layer 141, and the upper stacked structure UST in the vertical direction DR2 may be formed, e.g., of a same insulating material as the first and second cutting lines WLC1 and WLC2. Each of the first sub-cutting line SLC1 and the second sub-cutting line SLC2 may extend into the inter-structure insulating layer 126.

The first sub-cutting line SLC1 and the second sub-cutting line SLC2 may be formed between the first cutting line WLC1 and the second cutting line WLC2. Each of the first sub-cutting line SLC1 and the second sub-cutting line SLC2 may extend in the second direction DR2. The second sub-cutting line SLC2 and the first sub-cutting line SLC1 may be spaced apart from each other in the first direction DR1. Each of the first sub-cutting line SLC1 and the second sub-cutting line SLC2 may overlap the second vertical structure VS2 in the vertical direction DR3.

Referring to FIG. 3, the fourth interlayer insulating layer 144 may be formed on the third interlayer insulating layer 143. The bit line plug BLPG connected to the first vertical structure VS1 may be formed. The bit line BL extending in the first direction DR1 is formed on the fourth interlayer insulating layer 144. In this manner, the semiconductor memory device shown in FIG. 3 may be manufactured.

By way of summation and review, example embodiments provide a semiconductor memory device capable of reducing manufacturing costs by lowering a level of difficulty of processing by first forming a dummy vertical structure and a word line, and only then forming a sub-cutting line to overlap the dummy vertical structure in a vertical direction. Accordingly, the top surface of the sub-cutting line may be formed on the same plane as the top surface of an upper supporter formed on a cutting line.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a lower stacked structure extending in a first direction on a substrate, the lower stacked structure including a plurality of lower metal lines stacked in a vertical direction that is perpendicular to the first direction;
an upper stacked structure disposed on the lower stacked structure, the upper stacked structure including a plurality of upper metal lines stacked in the vertical direction;
a first interlayer insulating layer disposed on the upper stacked structure;
a second interlayer insulating layer disposed on the first interlayer insulating layer;
a third interlayer insulating layer disposed on the second interlayer insulating layer;
a bit line extending in the first direction and disposed on the third interlayer insulating layer;
a plurality of vertical structures extending in the vertical direction through the lower stacked structure, the upper stacked structure, and the first interlayer insulating layer, the plurality of vertical structures including a channel layer disposed along a sidewall and a bottom surface of the vertical structure;
a first cutting line structure penetrating extending in the vertical direction through the lower stacked structure, the upper stacked structure, the first interlayer insulating layer, the second interlayer insulating layer, and the third interlayer insulating layer, the first cutting line structure including:
a first portion including a first top surface and a first bottom surface, the first portion extending in the vertical direction from the first top surface to the first bottom surface through the lower stacked structure, the upper stacked structure, the first interlayer insulating layer, and the second interlayer insulating layer; and
a second portion disposed on the first portion, the second portion including a second top surface and a second bottom surface disposed on and in contact with the first top surface, the second portion extending in the vertical direction from the second top surface to the second bottom surface through the third interlayer insulating layer, wherein a first width of the first top surface of the first portion is smaller than a second width of the second bottom surface of the second portion;
a second cutting line structure extending in the vertical direction through the lower stacked structure, the upper stacked structure, the first interlayer insulating layer, the second interlayer insulating layer, and the third interlayer insulating layer, the second cutting line structure spaced apart from the first cutting line structure in the first direction;
a first sub-cutting line disposed between the first cutting line structure and the second cutting line structure along the first direction, the first sub-cutting line extending into any one of the plurality of vertical structures in the vertical direction; and a second sub-cutting line disposed between the first sub-cutting line and the second cutting line structure along the first direction, the second sub-cutting line disposed between and spaced apart from vertical structures of the plurality of vertical structures along the first direction, wherein each of the first cutting line structure, the second cutting line structure, the first sub-cutting line, and the second sub-cutting line includes a top surface disposed adjacent to the third interlayer insulating layer, and the top surface of each of the first cutting line structure, the second cutting line structure, the first sub-cutting line, and the second sub-cutting line is formed on a same plane disposed perpendicular to the vertical direction, and wherein each of the first cutting line structure, the second cutting line structure, the first sub-cutting line, and the second sub-cutting line extends in the vertical direction through each of the first interlayer insulating layer, the second interlayer insulating layer, and the third interlayer insulating layer and through at least two of the plurality of upper metal lines.

2. The semiconductor memory device as claimed in claim 1, wherein:
the first interlayer insulating layer includes a top surface;
each vertical structure of the plurality of vertical structures includes a top surface; and
the top surface of the first interlayer insulating layer and the top surface of each vertical structure of the plurality of vertical structures are formed on a same plane disposed perpendicular to the vertical direction.

3. The semiconductor memory device as claimed in claim 1, wherein:
the second interlayer insulating layer includes a bottom surface;
each vertical structure of the plurality of vertical structures includes a top surface; and
the bottom surface of the second interlayer insulating layer is in contact with the top surface of each vertical structure of the plurality of vertical structures.

4. The semiconductor memory device as claimed in claim 1, further comprising:
a fourth interlayer insulating layer disposed between the top surface of the first cutting line structure and a bottom surface of the bit line.

5. The semiconductor memory device as claimed in claim 1, wherein at least a part of the second portion of the first cutting line structure extending in the first direction overlaps the second interlayer insulating layer in the vertical direction.

6. The semiconductor memory device as claimed in claim 1, wherein:
the third interlayer insulating layer includes a top surface; and
the top surface of the first cutting line structure, the top surface of the second cutting line structure, the top surface of the first sub-cutting line, and the top surface of the second sub-cutting line are formed on a same plane disposed perpendicular to the vertical direction.

7. The semiconductor memory device as claimed in claim 1, wherein;
the first sub-cutting line includes a bottom surface;
the second sub-cutting line includes a bottom surface; and
the bottom surface of the first sub-cutting line and the bottom surface of the second sub-cutting line are higher in the vertical direction relative to the substrate than an uppermost surface of the lower stacked structure.

8. The semiconductor memory device as claimed in claim 1, wherein the plurality of vertical structures includes:
a first vertical structure connected to the bit line; and
a second vertical structure extending into the first sub-cutting line in the vertical direction without being connected to the bit line.

9. The semiconductor memory device as claimed in claim 8, wherein the first sub-cutting line includes a sidewall in contact with the first interlayer insulating layer.

10. The semiconductor memory device as claimed in claim 8, wherein:
the first cutting line includes a bottom surface having a first width in the first direction;
the second vertical structure includes a top surface having a second width in the first direction; and
the first width of the bottom surface of the first cutting line is greater than the second width of the top surface of the second vertical structure.

11. The semiconductor memory device as claimed in claim 1, wherein a height of the first sub-cutting line and the second sub-cutting line in the vertical direction ranges from 5000 angstroms to 10000 angstroms.

12. A semiconductor memory device, comprising:
a lower stacked structure extending in a first direction on a substrate, the lower stacked structure including a plurality of lower metal lines stacked in a vertical direction that is perpendicular to the first direction;
an upper stacked structure disposed on the lower stacked structure, the upper stacked structure including a plurality of upper metal lines stacked in the vertical direction;
a first interlayer insulating layer disposed on the upper stacked structure;
a second interlayer insulating layer disposed on the first interlayer insulating layer;
a third interlayer insulating layer disposed on the second interlayer insulating layer;
a plurality of vertical structures extending in the vertical direction through the lower stacked structure, the upper stacked structure, and the first interlayer insulating layer, the plurality of vertical structures including a channel layer disposed along a sidewall and a bottom surface of the vertical structure;
a first cutting line structure extending in the vertical direction through the lower stacked structure, the upper stacked structure, the first interlayer insulating layer, the second interlayer insulating layer, and the third interlayer insulating layer, the first cutting line structure including:
a first portion including a first top surface and a first bottom surface, the first portion extending in the vertical direction from the first top surface to the first bottom surface through the lower stacked structure, the upper stacked structure, the first interlayer insulating layer, and the second interlayer insulating layer; and
a second portion disposed on the first portion, the second portion penetrating including a second top surface and a second bottom surface disposed on the first top surface and contacting the first top surface, the second portion extending in the vertical direction from the second top surface to the second bottom surface through the third interlayer insulating layer, wherein a first width of the first top surface of the first portion is smaller than a second width of the second bottom surface of the second portion;

a second cutting line structure extending in the vertical direction through the lower stacked structure, the upper stacked structure, the first interlayer insulating layer, the second interlayer insulating layer, and the third interlayer insulating layer, the second cutting line structure spaced apart from the first cutting line structure in the first direction; and a first sub-cutting line disposed between the first cutting line structure and the second cutting line structure along the first direction, the first sub-cutting line extending into any one of the plurality of vertical structures in the vertical direction, wherein the first sub-cutting line includes a bottom surface that is higher in the vertical direction relative to the substrate than an uppermost surface of the lower stacked structure, and wherein each of the first cutting line structure, the second cutting line structure, and the first sub-cutting line extends in the vertical direction through each of the first interlayer insulating layer, the second interlayer insulating layer, and the third interlayer insulating layer and through at least two of the plurality of upper metal lines.

13. The semiconductor memory device as claimed in claim 12, further comprising:
a fourth interlayer insulating layer disposed on the third interlayer insulating layer; and
a bit line extending in the first direction and disposed on the fourth interlayer insulating layer.

14. The semiconductor memory device as claimed in claim 13, wherein:
the fourth interlayer insulating layer includes a bottom surface;
each of the first cutting line structure, the second cutting line structure, and the first sub-cutting line includes a top surface in contact with the bottom surface of the fourth interlayer insulating layer.

15. The semiconductor memory device as claimed in claim 12, further comprising:
a second sub-cutting line disposed between the first sub-cutting line and the second cutting line structure along the first direction, the second sub-cutting line disposed between and spaced apart from vertical structures of the plurality of vertical structures along the first direction.

16. The semiconductor memory device as claimed in claim 15, wherein a sidewall of the second sub-cutting line is in contact with a sidewall of another vertical structure of the plurality of vertical structures.

17. The semiconductor memory device as claimed in claim 12, wherein:
the first interlayer insulating layer includes a top surface;
each vertical structure of the plurality of vertical structures includes a top surface; and
the top surface of the first interlayer insulating layer and the top surfaces of the plurality of vertical structures are formed on a same plane disposed perpendicular to the vertical direction.

18. The semiconductor memory device as claimed in claim 12, wherein:
the second interlayer insulating layer includes a bottom surface;
each vertical structure of the plurality of vertical structures includes a top surface; and
the bottom surface of the second interlayer insulating layer is in contact with the top surface of each vertical structure of the plurality of vertical structures.

19. The semiconductor memory device as claimed in claim 12, wherein at least a part of the second portion of the first cutting line structure extending in the first direction overlaps the second interlayer insulating layer in the vertical direction.

20. A semiconductor memory device, comprising:
a lower stacked structure extending in a first direction on a substrate, the lower stacked structure including a plurality of lower metal lines stacked in a vertical direction that is perpendicular to the first direction;
an upper stacked structure disposed on the lower stacked structure, the upper stacked structure including a plurality of upper metal lines stacked in the vertical direction;
a first interlayer insulating layer disposed on the upper stacked structure, the first interlayer insulating layer including a top surface;
a second interlayer insulating layer disposed on the first interlayer insulating layer, the second interlayer insulating layer including a bottom surface;
a third interlayer insulating layer disposed on the second interlayer insulating layer;
a fourth interlayer insulating layer disposed on the third interlayer insulating layer, the fourth interlayer insulating layer including a bottom surface;
a bit line extending in the first direction and disposed on the fourth interlayer insulating layer;
a plurality of vertical structures extending in the vertical direction through the lower stacked structure, the upper stacked structure, and the first interlayer insulating layer, each vertical structure of the plurality of vertical structures including:
a channel layer disposed along a sidewall and a bottom surface of the vertical structure; and
a top surface, wherein:
the top surface of each vertical structure of the plurality of vertical structures and the top surface of the first interlayer insulating layer are formed on a same plane disposed perpendicular to the vertical direction; and
the top surface of each vertical structure of the plurality of vertical structures is in contact with the bottom surface of the second interlayer insulating layer;
a first cutting line structure extending in the vertical direction through the lower stacked structure, the upper stacked structure, the first interlayer insulating layer, the second interlayer insulating layer, and the third interlayer insulating layer, the first cutting line structure including:
a first portion including a first top surface and a first bottom surface, the first portion extending in the vertical direction from the first top surface to the first bottom surface through the lower stacked structure, the upper stacked structure, the first interlayer insulating layer, and the second interlayer insulating layer; and
a second portion disposed on the first portion, the second portion including a second top surface and a second bottom surface disposed on the first top surface and contacting the first top surface, the second portion extending in the vertical direction from the second top surface to the second bottom surface through the third interlayer insulating layer, wherein a first width of the first top surface of the first portion is smaller than a second width of the second bottom surface of the second portion;

a second cutting line structure extending in the vertical direction through the lower stacked structure, the upper stacked structure, the first interlayer insulating layer, the second interlayer insulating layer, and the third interlayer insulating layer, the second cutting line structure spaced apart from the first cutting line structure in the first direction;

a first sub-cutting line disposed between the first cutting line structure and the second cutting line structure along the first direction, the first sub-cutting line extending into any one of the plurality of vertical structures in the vertical direction, the first sub-cutting line including a bottom surface; and a second sub-cutting line disposed between the first sub-cutting line and the second cutting line structure along the first direction, the second sub-cutting line disposed between and spaced apart from vertical structures of the plurality of vertical structures along the first direction, the second sub-cutting line including a bottom surface, wherein each of the first cutting line structure, the second cutting line structure, the first sub-cutting line, and the second sub-cutting line includes a top surface disposed adjacent to the third interlayer insulating layer, and the top surface of each of the first cutting line structure, the second cutting line structure, the first sub-cutting line, and the second sub-cutting line is formed on a same plane disposed perpendicular to the vertical direction, wherein the bottom surface of the fourth interlayer insulating layer is in contact with each of the top surface of the first cutting line structure, the top surface of the second cutting line structure, the top surface of the first sub-cutting line, and the top surface of the second sub-cutting line, wherein the bottom surface of the first sub-cutting line and the bottom surface of the second sub-cutting line are higher in the vertical direction relative to the substrate than an uppermost surface of the lower stacked structure, and wherein each of the first cutting line structure, the second cutting line structure, the first sub-cutting line and the second sub-cutting line extends in the vertical direction through each of the first interlayer insulating layer, the second interlayer insulating layer, and the third interlayer insulating layer and through at least two of the plurality of upper metal lines.

* * * * *